United States Patent
Khemka et al.

(10) Patent No.: US 8,963,241 B1
(45) Date of Patent: Feb. 24, 2015

(54) INTEGRATED MOS POWER TRANSISTOR WITH POLY FIELD PLATE EXTENSION FOR DEPLETION ASSIST

(75) Inventors: Vishnu Khemka, Phoenix, AZ (US); Ronghua Zhu, Chandler, AZ (US); Tahir Arif Khan, Tempe, AZ (US); Bernhard Heinrich Grote, Phoenix, AZ (US)

(73) Assignee: Maxim Integrated Products, Inc., San Jose, CA (US)

( * ) Notice: Subject to any disclaimer, the term of this patent is extended or adjusted under 35 U.S.C. 154(b) by 134 days.

(21) Appl. No.: 13/460,717

(22) Filed: Apr. 30, 2012

Related U.S. Application Data

(63) Continuation-in-part of application No. 13/312,827, filed on Dec. 6, 2011, and a continuation-in-part of application No. 13/446,987, filed on Apr. 13, 2012, said application No. 13/312,827 is a continuation-in-part of application No. 12/618,515, filed on Nov. 13, 2009, now abandoned, said application No. 13/446,987 is a continuation-in-part of application No. 12/618,515, and a continuation-in-part of application No. 13/312,827.

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC .................... 257/341; 257/343; 257/E29.256

(58) Field of Classification Search
CPC .................... H01L 29/402; H01L 29/0653
USPC .................... 257/341, 343, E29.256
See application file for complete search history.

(56) References Cited

U.S. PATENT DOCUMENTS

| | | | |
|---|---|---|---|
| 4,779,126 A * | 10/1988 | Herman | 257/113 |
| 5,121,176 A | 6/1992 | Quigg | |
| 5,229,308 A | 7/1993 | Vo et al. | |

(Continued)

FOREIGN PATENT DOCUMENTS

JP  2004-135163  4/2004

OTHER PUBLICATIONS

Tapani Makkonen, Tuomas Pensala, Juha Vartianinen, Jouni V. Knuuttila, Jyrki Kaitila and Martti M. Salomaa; Estimating Materials Parameters in Thin-Film BAW Resonators Using Measured Dispersion Curves; Jan. 2004; IEEE; vol. 51, No. 1; pp. 42-51.

(Continued)

*Primary Examiner* — Howard Weiss
(74) *Attorney, Agent, or Firm* — Advent, LLP

(57) ABSTRACT

A split gate power transistor includes a doped substrate, a gate oxide layer on the substrate, and a split polysilicon layer over the gate oxide layer, which forms a polysilicon gate and a polysilicon field plate. The two polysilicon portions are separated by a gap. The field plate is electrically coupled to a source of the split gate power transistor. One or more polysilicon extension tabs extend from the field plate to at least above the edge of the first doped region. The polysilicon gate is cut to form a cut-out region for the end of each polysilicon extension tab extending toward the body substrate. The one or more polysilicon extension tabs force the portion of the transition region underneath the field plate into deep-depletion, thereby preventing the formation of a hole inversion layer in this region.

14 Claims, 12 Drawing Sheets

(56) References Cited

U.S. PATENT DOCUMENTS

| | | | |
|---|---|---|---|
| 5,252,848 A | 10/1993 | Adler et al. | |
| 5,273,922 A | 12/1993 | Tsoi | |
| 5,382,818 A * | 1/1995 | Pein | 257/347 |
| 5,539,238 A | 7/1996 | Malhi | |
| 5,585,294 A | 12/1996 | Smayling et al. | |
| 5,719,085 A | 2/1998 | Moon et al. | |
| 5,719,421 A | 2/1998 | Hutter et al. | |
| 5,811,850 A | 9/1998 | Smayling et al. | |
| 5,844,275 A | 12/1998 | Kitamura et al. | |
| 5,844,347 A | 12/1998 | Takayama et al. | |
| 5,917,222 A | 6/1999 | Smayling et al. | |
| 5,918,137 A | 6/1999 | Ng et al. | |
| 5,976,948 A | 11/1999 | Werner et al. | |
| 6,091,110 A | 7/2000 | Hebert et al. | |
| 6,118,167 A | 9/2000 | DiSimone et al. | |
| 6,143,623 A | 11/2000 | Tsuda et al. | |
| 6,144,069 A | 11/2000 | Tung | |
| 6,144,070 A | 11/2000 | Devore et al. | |
| 6,242,787 B1 | 6/2001 | Nakayama et al. | |
| 6,258,692 B1 | 7/2001 | Chu et al. | |
| 6,307,447 B1 | 10/2001 | Barber et al. | |
| 6,333,232 B1 | 12/2001 | Kunikiyo | |
| 6,335,259 B1 | 1/2002 | Jeng | |
| 6,399,461 B1 | 6/2002 | Liu et al. | |
| 6,413,827 B2 | 7/2002 | Farrar | |
| 6,444,541 B1 | 9/2002 | Lai et al. | |
| 6,455,399 B2 | 9/2002 | Malik et al. | |
| 6,472,324 B2 | 10/2002 | Kusakabe et al. | |
| 6,472,708 B1 | 10/2002 | Hshieh et al. | |
| 6,482,718 B2 | 11/2002 | Shiozawa et al. | |
| 6,495,424 B2 | 12/2002 | Kunikiyo | |
| 6,495,898 B1 | 12/2002 | Iwamatsu et al. | |
| 6,501,148 B2 | 12/2002 | Tsuda et al. | |
| 6,521,923 B1 | 2/2003 | D'Anna et al. | |
| 6,524,929 B1 | 2/2003 | Xiang et al. | |
| 6,528,395 B1 | 3/2003 | Nakamura | |
| 6,541,382 B1 | 4/2003 | Cheng et al. | |
| 6,596,607 B2 | 7/2003 | Ahn | |
| 6,624,016 B2 | 9/2003 | Wu | |
| 6,743,695 B2 | 6/2004 | Lee et al. | |
| 6,747,333 B1 | 6/2004 | Xiang et al. | |
| 6,750,117 B1 | 6/2004 | Hung et al. | |
| 6,773,995 B2 | 8/2004 | Shin et al. | |
| 6,781,194 B2 | 8/2004 | Baliga | |
| 6,806,131 B2 | 10/2004 | Bromberger et al. | |
| 6,979,621 B2 | 12/2005 | Hshieh et al. | |
| 7,033,909 B2 | 4/2006 | Kim et al. | |
| 7,112,513 B2 | 9/2006 | Smythe, III et al. | |
| 7,126,193 B2 | 10/2006 | Baiocchi et al. | |
| 7,235,845 B2 | 6/2007 | Xu et al. | |
| 7,262,476 B2 | 8/2007 | Bude et al. | |
| 7,282,765 B2 | 10/2007 | Xu et al. | |
| 7,291,541 B1 | 11/2007 | Foote | |
| 7,297,582 B2 | 11/2007 | Abadeer et al. | |
| 7,405,443 B1 | 7/2008 | Zuniga et al. | |
| 7,479,688 B2 | 1/2009 | Deshpande et al. | |
| 7,504,676 B2 | 3/2009 | Bhalla et al. | |
| 7,851,857 B2 * | 12/2010 | Fu et al. | 257/343 |
| 2002/0197823 A1 | 12/2002 | Yoo et al. | |
| 2004/0115881 A1 | 6/2004 | Choi et al. | |
| 2005/0073007 A1 | 4/2005 | Chen et al. | |
| 2005/0148153 A1 | 7/2005 | Takahashi | |
| 2006/0141731 A1 | 6/2006 | Kim | |
| 2006/0183296 A1 | 8/2006 | Yoo et al. | |
| 2007/0032029 A1 | 2/2007 | Chow et al. | |
| 2007/0138548 A1 | 6/2007 | Kocon et al. | |
| 2007/0254453 A1 | 11/2007 | Ang | |
| 2008/0124890 A1 | 5/2008 | Wu et al. | |
| 2008/0180974 A1 * | 7/2008 | Shiraishi et al. | 363/24 |
| 2008/0286936 A1 | 11/2008 | Zhao | |
| 2008/0293213 A1 | 11/2008 | Yang et al. | |
| 2009/0140372 A1 | 6/2009 | Hodel et al. | |
| 2011/0115019 A1 | 5/2011 | Giles et al. | |
| 2012/0211812 A1 * | 8/2012 | Du et al. | 257/296 |

OTHER PUBLICATIONS

P. Goarin, G.E.J. Koops, R. Van Dalen, C. Le Cam, J. Saby; Split-gate Resurf Stepped Oxide (RSO) MOSFETs for 25v applications with record low gate-to-drain charge (Abstract); May 27-31, 2007; accessed Nov. 2, 2009; Power Semiconductor Devices and IC's, 19th International Symposium.

* cited by examiner

| Gate Type | R*A mΩ•mm² | ΔR*A | $Q_G$ fC/μm | R*$Q_G$ mΩ•nC | ΔR*$Q_G$ | $BV_{DSS}$ V | $V_{OX}$@BV V | $V_{OX}$@hot V |
|---|---|---|---|---|---|---|---|---|
| Continuous | 8.1 | - | 21.0 | 95 | - | 25.3 | 1.8 | 1.1 |
| Split | 8.5 | +5% | 12.6 | 59 | -37% | 25.6 | 4.1 | 4.7 |
| Split with Bridge | 10.6 | +30% | 11.8 | 69 | -27% | 25.6 | 1.1 | 2.4 |
| Split with Bridge/Halo | 7.8 | -3% | 10.7 | 49 | -48% | 24.6 | 2.1 | 3.2 |

| | R*L (Ω•μm) | $BV_{DSS}$ (V) | $V_{OX}$@$BV_{DSS}$ (V) | $Q_G$ (fC/μm) | R*$Q_G$ (mΩ•nC) |
|---|---|---|---|---|---|
| Continuous | 4498 | 25.3 | 2.9 | 21.0 | 95 |
| Split | 4716 | 25.6 | 5.6 | 12.6 | 60 |
| Split with Bridge | 5865 | 25.6 | 2.4 | 11.8 | 69 |
| Split with Disc. Bridges | 4895 | 25.6 | 2.4 | 12.4 | 61 |

| Gate Type | R*W Ω•μm | R*A mΩ•mm² | ΔR*A | $Q_G$ fC/μm | R*$Q_G$ mΩ•nC | ΔR*$Q_G$ | $BV_{DSS}$ V | $V_{ox}$@BV V | $V_{ox}$@hot V |
|---|---|---|---|---|---|---|---|---|---|
| Continuous | 6033 | 19.0 | - | 18.4 | 111 | - | 53 | 1.4 | 1.3 |
| Split over active | 6750 | 21.3 | +12% | 10.1 | 68 | -39% | 55 | 3.4 | 5.1 |
| POR PLDD5 fill | 8699 | 27.4 | +44% | 11.1 | 97 | -13% | 44 | 0.6 | 0.5 |
| Rec. PLDD5 fill | 6722 | 20.8 | +9% | 11.3 | 76 | -32% | 50 | 1.0 | 0.8 |

Fig. 9

INTEGRATED MOS POWER TRANSISTOR WITH POLY FIELD PLATE EXTENSION FOR DEPLETION ASSIST

RELATED APPLICATIONS

This Patent Application is a continuation in part of U.S. patent application Ser. No. 13/312,827, filed Dec. 6, 2011, and entitled, "INTEGRATED MOS POWER TRANSISTOR WITH THIN GATE OXIDE AND LOW GATE CHARGE." This Patent Application is also a continuation in part of U.S. patent application Ser. No. 13/446,987, filed Apr. 13, 2012, and entitled, "INTEGRATED MOS POWER TRANSISTOR WITH THIN GATE OXIDE AND LOW GATE CHARGE." U.S. patent application Ser. No. 13/312,827 is a continuation in part of U.S. patent application Ser. No. 12/618,515, filed Nov. 13, 2009, and entitled, "IMPROVED MOS POWER TRANSISTOR." U.S. patent application Ser. No. 13/446,987 is a continuation in part of U.S. patent application Ser. No. 12/618,515 and is a continuation in part of U.S. patent application Ser. No. 13/312,827. This application incorporates U.S. patent application Ser. No. 12/618,515, U.S. patent application Ser. No. 13/312,827, and U.S. patent application Ser. No. 13/446,987 in their entireties by reference.

FIELD OF THE INVENTION

The present invention relates to the field of power transistors. More particularly, the present invention relates to the field of integrated MOS power transistors with reduced gate charge.

BACKGROUND OF THE INVENTION

A power supply is a device or system that supplies electrical or other types of energy to an output load or group of loads. The term power supply can refer to a main power distribution system and other primary or secondary sources of energy. A switched-mode power supply, switching-mode power supply or SMPS, is a power supply that incorporates a switching regulator. While a linear regulator uses a transistor biased in its active region to specify an output voltage, a SMPS actively switches a transistor between full saturation and full cutoff at a high rate. The resulting rectangular waveform is then passed through a low-pass filter, typically an inductor and capacitor (LC) circuit, to achieve an approximated output voltage.

SMPS is currently the dominant form of voltage conversion device because of its high power conversion efficiency, small size and weight, and low cost. SMPS takes input power from a source, such as a battery or wall socket, and converts the input power into short pulses according to the demand for power from the circuits coupled to the SMPS output.

MOSFETs (Metal-Oxide-Semiconductor Field-Effect Transistors) are commonly used in SMPS. MOSFETs are commonly manufactured separately, as discrete transistors. Each MOSFET is then connected to other integrated circuits that are part of the SMPS. Using discrete devices in this manner increases cost and size of the overall SMPS.

High performing MOSFETs are significant to the conversion efficiency of SMPS because MOSFETs are some of the most power dissipating components in the SMPS. Also, the maximum possible switching frequency of the MOSFETs dictates the size, cost, and power losses in the inductors and capacitors included in the SMPS output filter circuits. Under normal SMPS operation, MOSFETs are turned on and off rapidly, so for efficient operation the MOSFETs should have low values of both resistance and gate capacitance.

A MOSFET has a gate, a drain, and a source terminal, as well as a fourth terminal called the body, base, bulk, or substrate. The substrate simply refers to the bulk of the semiconductor in which the gate, source, and drain lie. The fourth terminal functions to bias the transistor into operation. The gate terminal regulates electron flow through a channel region in the substrate, either enabling or blocking electron flow through the channel Electrons flow through the channel from the source terminal towards the drain terminal when influenced by an applied voltage.

The channel of a MOSFET is doped to produce either an N-type semiconductor or a P-type semiconductor. The drain and source may be doped of opposite type to the channel, in the case of enhancement mode MOSFETs, or doped of similar type to the channel as in depletion mode MOSFETs. The MOSFET utilizes an insulator, such as silicon dioxide, between the gate and the substrate. This insulator is commonly referred to as the gate oxide. As such, the gate terminal is separated from the channel in the substrate by the gate oxide.

When a voltage is applied between the gate and source terminals, the electric field generated penetrates through the gate oxide and creates a so-called "inversion layer", or channel, at the semiconductor-insulator interface. The inversion channel is of the same type, P-type or N-type, as the source and drain, so as to provide a channel through which current can pass. Varying the voltage between the gate and substrate modulates the conductivity of this layer, which functions to control the current flow between drain and source.

A power MOSFET is a specific type of MOSFET widely used as a low-voltage switch, for example less than 200V. A lateral power MOSFET refers to a configuration where both the drain and the source are positioned lateral of each other, such as both at the top surface of the substrate. This is in contrast to a vertical power MOSFET where the drain and source are stacked vertically relative to each other, such as the source at the top surface of the substrate and the drain at the bottom surface.

One limiting factor in how fast the power MOSFET can be switched on and off is the amount of gate charge needed to turn the transistor on and off. The gate charge refers to the number of electrons that are moved into and out of the gate to turn the transistor on and off, respectively. The larger the needed gate charge, the more time to switch the transistor on and off. There is an advantage to quickly switching the power transistor in a switch-mode power supply. The higher the frequency, the smaller the size of the discrete components used in the gate drive circuit of the SMPS. Smaller components are less expensive than larger components.

FIG. 1 illustrates a cut-out side view of an exemplary configuration of a conventional lateral power MOSFET. In this exemplary configuration, the substrate 10 is doped to form a P-type region, or well, 12 and a N-type region, or well, 14. The P-type well 12 includes a double diffused source 16 having a merged contact 24 between a P+ region 20 and a N+ region 22. The contact 24 shorts the P+ region 20 and the N+ region 22 together. The contact 24 functions as a source contact of the power transistor, and the source is shorted to the body of the substrate, which is P-type in this exemplary configuration. A source contact terminal 42 is coupled to the contact 24, and therefore to the source 16. The substrate 10 is also doped to form a N+ region 18 within the N-type region 14. The N+ region 18 functions as the drain of the power transistor. A drain contact terminal 40 is coupled to the drain 18. A trench 26 is formed in a top surface of the substrate 10.

The trench 26 is filled with field oxide. The trench 26 can be formed using Shallow Trench Isolation (STI) and in this case the field oxide filled trench is referred to as a shallow trench isolation (STI) region.

A gate oxide 28 is formed on the top surface of the substrate 10. A polysilicon gate 30 is formed over the gate oxide 28. As shown in FIG. 1, the gate oxide layer 28 between the polysilicon gate 30 and the substrate 10 is a thin oxide layer. The polysilicon gate 30 extends over the STI region to support high drain-to-gate voltage.

There are three main regions in the substrate 10 relative to the operation of the power transistor: a channel region, a transition region, and a drift region. The channel region is formed underneath the polysilicon gate 30 and in the P-type region 12 of the substrate 10. In other words, the channel region is formed where the polysilicon gate 30 overlaps the P-type region 12. The drift region is the portion of the N-type region 14 underneath the trench 26, or the STI region. The drift region is where most of the drain-to-gate voltage is dropped in the transistor off state. The STI region is necessary to achieve a high drain-to-gate voltage. If the polysilicon gate 30 were to instead terminate over the thin gate oxide, this would result in too high a voltage across the gate oxide and the power transistor would not function. As such, the STI region and the polysilicon gate extension over the STI region are necessary to drop the high gate-to-drain voltage.

The transition region is the portion of the N-type region 14 underneath the gate oxide 28 and the polysilicon gate 30. The transition region provides a current flow path from the channel region to the drift region when the power transistor is turned on. The transition region is also referred to as the accumulation region or the neck region. In many applications, the transition region accounts for the largest single component of on-resistance in a low-voltage power MOSFET. The length of the transition region is an important design consideration, where the length refers to the horizontal direction in FIG. 1. If the length is too short, the on-resistance of the power MOSFET increases, and the device suffers from early quasi-saturation when turned on hard. If the length is too long, the on-resistance saturates, the specific on-resistance increases, and the breakdown voltage drops. The portion of the polysilicon gate 30 positioned over the transition region accounts for a significant portion of the gate capacitance, and therefore the gate charge.

SUMMARY OF THE INVENTION

A split gate power transistor includes a laterally configured power MOSFET including a doped substrate, a gate oxide layer formed on a surface of the substrate, and a split polysilicon layer formed over the gate oxide layer. The polysilicon layer is cut into two electrically isolated portions, a first portion forming a polysilicon gate positioned over a channel region and a first portion of a transition region of the substrate, and a second portion forming a polysilicon field plate formed over a second portion of the transition region and a shallow trench isolation region. The two polysilicon portions are separated by a gap. The field plate is electrically coupled to a source of the split gate power transistor. The substrate has a first doped region and a second doped region of an opposite type as the first doped region. The source and the channel region are included in the first doped region and the transition region, the shallow trench isolation region, a drift region underneath the shallow trench isolation region, and a drain are included in the second doped region. One or more polysilicon extension tabs extend width-wise from the field plate to at least above the edge of the first doped region. The polysilicon gate is cut to form a cut-out region for the end of each polysilicon extension tab extending toward the first doped region. The one or more polysilicon extension tabs force the portion of the transition region underneath the field plate into deep-depletion, thereby preventing the formation of a hole inversion layer in this region.

In an aspect, a power transistor is disclosed. The power transistor includes a doped substrate, a gate oxide, a gate, a field plate, and means for driving a transition region underneath the field plate into deep-depletion. The doped substrate includes a source and a channel region within a first doped region, and a drain, a transition region, and a trench within a second doped region. The trench is formed in a first surface of the substrate and the trench is filled with an insulating material. Along a width of the substrate the channel region is positioned between the source and the transition region, the transition region is positioned between the channel region and the trench, and the trench is positioned between the transition region and the drain. The gate oxide layer is positioned on the first surface of the substrate. The gate has a gate width and a gate length. The gate is positioned on the gate oxide layer and the gate width is aligned over the channel region and a first portion of the transition region. The field plate has a field plate width and a field plate length. The field plate is positioned on the gate oxide and the field plate width is aligned over a second portion of the transition region and over a portion of the trench. A gap having a gap width and a gap length is formed between the gate and the field plate. The gate and the field plate are separated by the gap width. The field plate is electrically coupled to the source via a conductive trace. The means for driving drives the second portion of the transition region underneath the field plate into deep-depletion.

In some embodiments, the means for driving includes one or more body extension regions extending from the first doped region and having a same doping type as the first doped region. In some embodiments, a width of each body extension region extends along the substrate width from the channel region to at least underneath an edge of the field plate adjacent to the gap, and a length of each body extension region extends along a partial distance of the gap length, wherein along portions of the gap length the gap is aligned over the one or more body extension regions and along remaining portions of the gap length the gap is aligned over a third portion of the transition region. In other embodiments, the means for driving includes one or more extension tabs coupled to the field plate along the field plate length and one or more cut-out regions formed within the gate along the gate length, each extension tab is aligned with one of the cut-out regions and extends toward the gate to at least above an edge of the first doped region of the substrate. In some embodiments, the means for driving includes both the one or more extension tabs and the one or more body extension regions, as well as one or more cut-out regions formed within the gate along the gate length.

In another aspect, a power transistor is disclosed. The power transistor includes a doped substrate, a gate oxide, a gate, a field plate, and one or more extension tabs. The doped substrate includes a source and a channel region within a first doped region, and a drain, a transition region, and a trench within a second doped region. The trench is formed in a first surface of the substrate and the trench is filled with an insulating material. Along a width of the substrate the channel region is positioned between the source and the transition region, the transition region is positioned between the channel region and the trench, and the trench is positioned between the transition region and the drain. The gate oxide layer is positioned on the first surface of the substrate. The gate has a gate width and a gate length. The gate is positioned on the gate oxide layer and the gate width is aligned over the channel region and a first portion of the transition region, further wherein the gate includes one or more cut-out regions along the gate length. The field plate has a field plate width and a field plate length. The field plate is positioned on the gate oxide and the field plate width is aligned over a second portion of the transition region and over a portion of the trench. A gap having a gap width and a gap length is formed between the gate and the field plate. The gate and the field plate are separated by the gap width. The field plate is electrically coupled to the source via a conductive trace. The one or more extension tabs are coupled to the field plate along the field plate length. Each extension tab is aligned with one of the cut-out regions and extends toward the gate to at least above an edge of the first doped region of the substrate.

In some embodiments, each extension tab includes a first end coupled to the field plate and a second end positioned within one of the cut-out regions in the gate, wherein each extension tab is physically and electrically isolated from the gate. In some embodiments, one or more of the cut-out regions extends the gate width, thereby splitting the gate into separate gate segments. In some embodiments, the power transistor also includes one or more metal layers coupled to each separate gate segment to electrically couple together all of the separate gate segments. In other embodiments, the power transistor also includes one of more polysilicon layers coupled to each separate gate segment to electrically couple together all of the separate gate segments. In some embodiments, one or more of the cut-out regions extends a partial distance of the gate width. In some embodiments, a ratio of a length of the extension tab to the gate length is less than or equal to 1:50. In some embodiments, the gate, the field plate, and the one or more extension tabs comprise polysilicon. In some embodiments, the first doped region is a P-type region and the second doped region is a N-type region. In some embodiments, the power transistor is a lateral double-diffused metal-oxide-semiconductor field-effect transistor. In some embodiments, the doped substrate also includes a drift region within the second doped region, wherein the drift region is positioned under the trench. In some embodiments, the power transistor also includes a conductive drain terminal coupled to the drain and a conductive source terminal coupled to the source, wherein the source terminal is coupled to the field plate via the conductive trace. In some embodiments, the substrate comprises a silicon substrate. In some embodiments, the source includes a double-diffused region.

In yet another aspect, a method of fabricating a power transistor is disclosed. The method includes doping a substrate to form a source and a channel region within a first doped region, and a drain and a transition region within a second doped region. Along a width of the substrate the channel region is positioned between the source and the transition region, the transition region is positioned between the channel region and the drain. The method also includes forming a trench within a portion of the second doped region proximate the drain such that the trench is positioned between the transition region and the drain. The method also includes filling the trench with an insulating material. The method also includes applying a gate oxide layer to a top surface of the substrate. The method also includes forming a conductive layer over the channel region, the transition region, and a portion of the trench. The method also includes removing a portion of the conductive layer, thereby forming a gate and a field plate separated by a gap, and also forming one or more cut-out regions in the gate along a gate length and one or more extension tabs coupled to the field plate along a field plate length. Each extension tab is aligned with one of the cut-out regions and extends toward the gate to at least above an edge of the first doped region of the substrate. A gate width is positioned over the channel region and a first portion of the transition region, and a field plate width is positioned over a second portion of the transition region and a portion of the trench. The method also includes forming a conductive trace to electrically couple the second conductive layer portion to the source.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIG. 9 illustrates a table of characteristics corresponding to comparable power transistors.

DETAILED DESCRIPTION OF THE EMBODIMENTS

Figure 1:
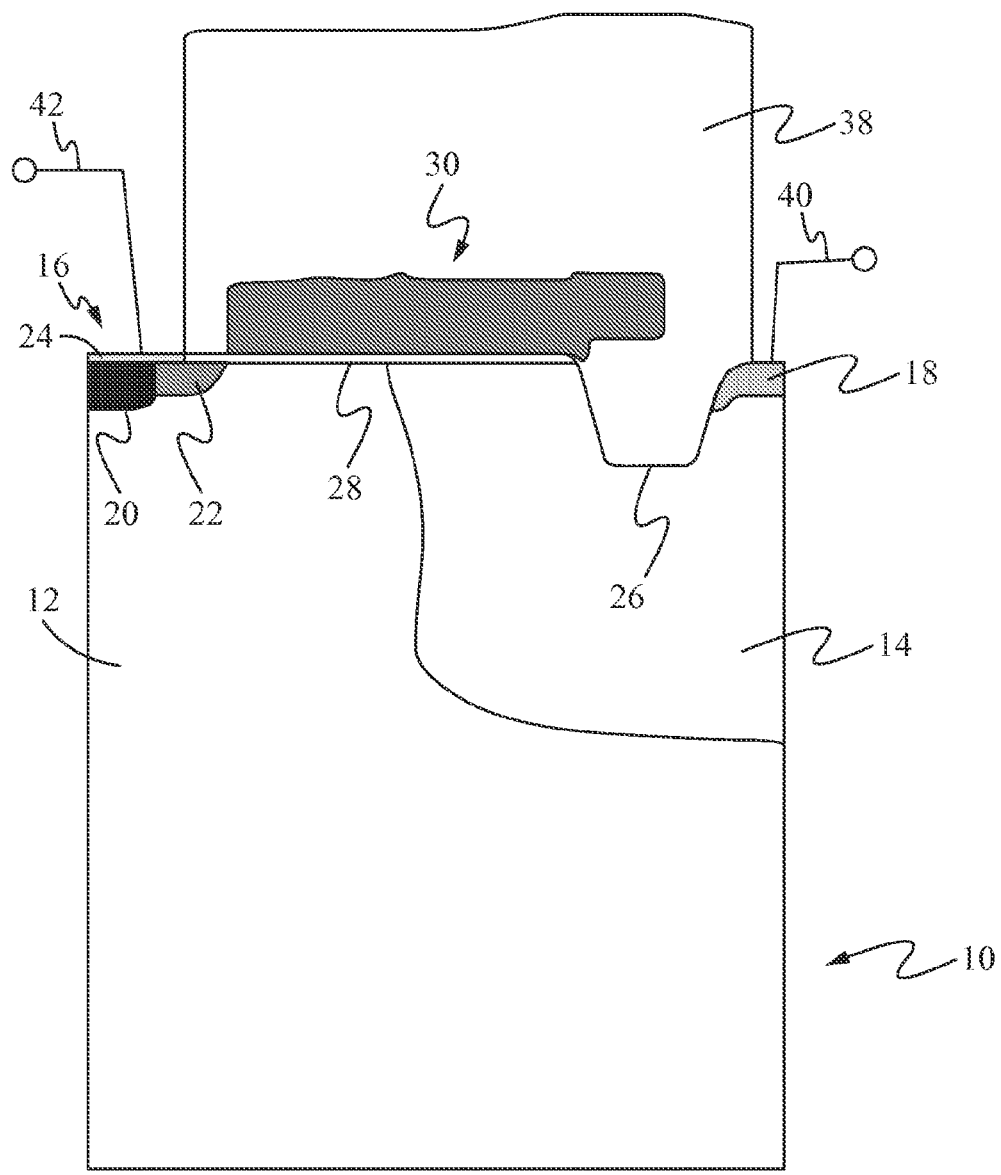
FIG. 1 illustrates a cut-out side view of an exemplary configuration of a conventional lateral power MOSFET.

Embodiments of the present application are directed to a split gate power transistor. Those of ordinary skill in the art will realize that the following detailed description of the split gate power transistor is illustrative only and is not intended to be in any way limiting. Other embodiments of the split gate power transistor will readily suggest themselves to such skilled persons having the benefit of this disclosure.

Reference will now be made in detail to implementations of the split gate power transistor as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments of a split gate power transistor include a laterally configured power MOSFET including a doped silicon substrate, a gate oxide layer formed on a surface of the substrate, and a split polysilicon layer formed over the gate oxide layer. The polysilicon layer is cut into two electrically isolated portions separated by a gap, a first portion forming a polysilicon gate positioned over a channel region of the substrate and a first portion of a transition region, and a second portion forming a polysilicon field plate formed over a second portion of a transition region of the substrate. The field plate also extends over a drift region of the substrate, where the drift region is under a field oxide filled trench formed in the substrate. The field plate is electrically coupled to a source of the power transistor.

The polysilicon layer is cut over the transition region. As a significant portion of the gate capacitance is due to the portion of the polysilicon gate formed over the transition region, removal of the cut polysilicon over the transition region reduces the gate capacitance, and therefore the gate charge. For a given on-resistance, the split gate configuration reduces the gate charge per cycle by about 50%. The gate charge determines how fast a switch is turned on and off. Reducing the gate charge allows for faster switching, and therefore higher frequency, at the same efficiency for the entire system. The higher frequency allows for the use of smaller discrete components which reduces costs. The split gate power transistor configuration is applicable to all switchable power supply integrated circuits that have internal switches. This configuration is not limited to integrated MOSFETs. The split gate power transistor configuration can be applied to any lateral power MOSFET, either integrated or discrete.

Figure 2:
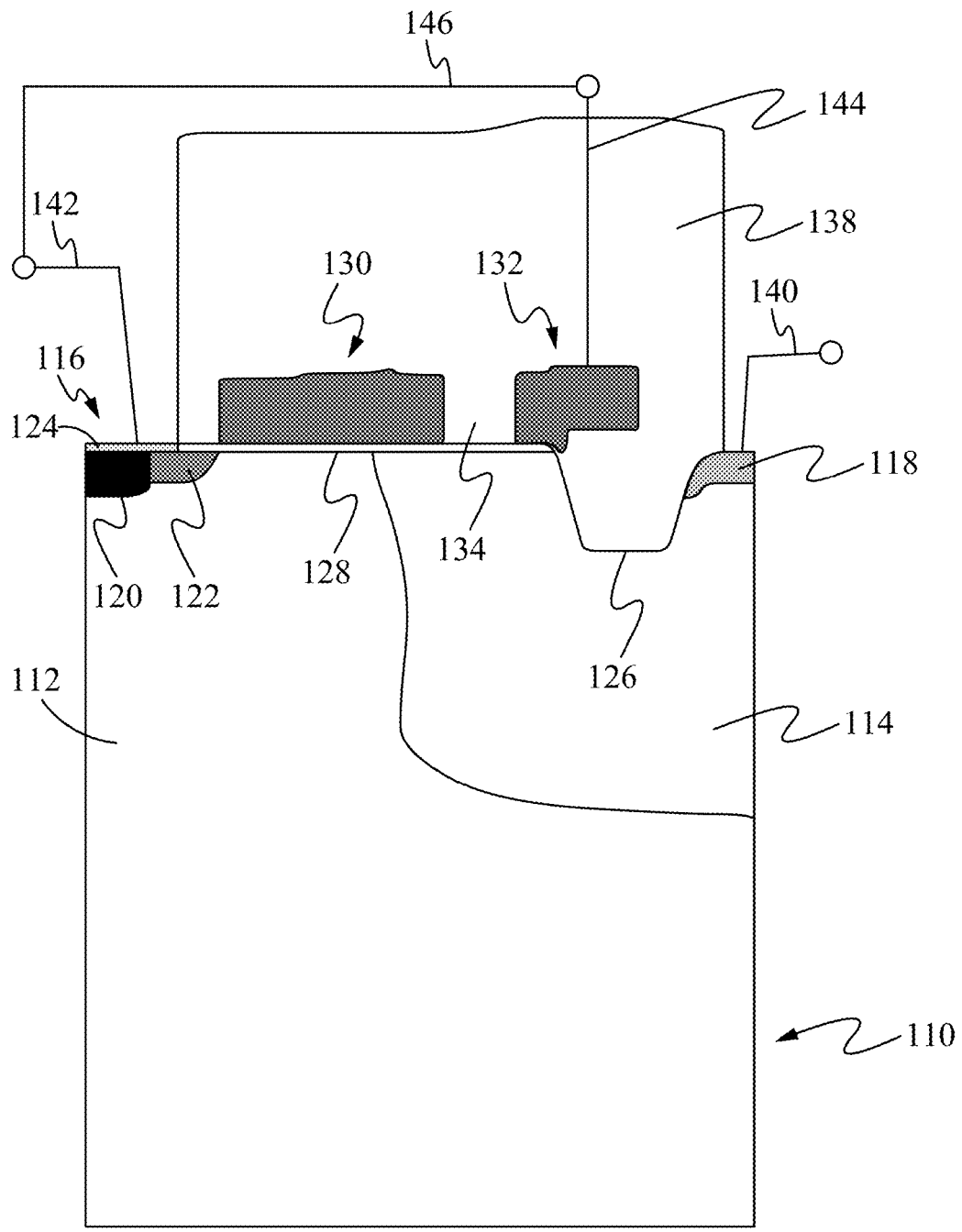
FIG. 2 illustrates a cut-out side view of a split gate laterally-configured power transistor according to an embodiment.

FIG. 2 illustrates a cut-out side view of a split gate laterally-configured power transistor according to an embodiment. In this exemplary configuration, the power transistor is a N-channel double-diffused MOSFET (N-channel DMOSFET). The substrate 110 is doped to form a P-type region 112 and a N-type region 114. The P-type region 112 includes a double-diffused source 116 having a merged contact 124 between a P+ region 120 and a N+ region 122. The contact 124 shorts the P+ region 120 and the N+ region 122 together. The contact 124 functions as a source contact of the split gate power transistor, and the source is shorted to the body of the substrate, which is P-type. The P-type region extends across the entire width of the lower portion of the substrate 110, including underneath the N-type region 114 on the right hand side of FIG. 2. A source contact terminal 142 is coupled to the contact 124, and therefore to the source 116. The substrate 110 is also doped to form a N+ region 118 within the N-type region 114. The N+ region 118 functions as the drain of the split gate power transistor. A drain contact terminal 140 is coupled to the drain 118. A trench 126 is formed in a top surface of the substrate 110. The trench 126 is filled with field oxide. In some embodiments, the trench 126 is formed using a Shallow Trench Isolation (STI) process, and the field oxide filled trench is referred to as a STI region. In other embodiments, the trench 126 is formed using any conventional semiconductor fabrication technique capable of removing a portion of the substrate to form a thick field oxide region.

A gate oxide 128 is formed on the top surface of the substrate 110. In some embodiments, the gate oxide layer is deposited using conventional semiconductor deposition processes. A polysilicon layer is formed over the gate oxide 128. A slice of the polysilicon layer is then removed, forming two electrically isolated polysilicon portions. In some embodiments, the polysilicon portions are formed using conventional semiconductor deposition and etching processes. A first polysilicon portion forms a polysilicon gate 130. A second polysilicon portion forms a field plate 132. The polysilicon gate 130 and the field plate 132 are physically separated by a gap 134, which corresponds to the removed slice of polysilicon. An insulating oxide 138 covers the polysilicon gate 130 and the field plate 132. As shown in FIG. 2, the gate oxide layer 128 between the polysilicon gate 130 and the substrate 110, and the gate oxide layer 128 between the field plate 132 and the substrate 110 is a thin oxide layer. The field plate 132 is electrically isolated from the polysilicon gate 130 by the gap 134, and the field plate 132 is electrically coupled to the source 116. In many applications, power transistors are laid out having many interdigitated stripes, for example a source stripe, a gate stripe, and a drain stripe. For example, the drain stripe functions as the drain contact terminal 140, and the source stripe functions as the source contact terminal 142. In the split gate power transistor, the gate and the field plate can also be laid out in stripes, separated by the gap. For example, the field plate stripe functions as a field plate contact terminal, schematically illustrated in FIG. 2 as field plate contact terminal 144. In reference to FIG. 2, the stripes are oriented into and out of the plane of the page. If the gate is normally connected at end of its stripe, which can be hundreds of microns long, the field plate similarly extends as a stripe, the end of which is electrically connected to the source stripe by a conductive trace. FIG. 2 conceptually illustrates this point as a conductive trace 146 coupling the field plate contact terminal 144 and the source contact terminal 142. Alternatively, the field plate 132 and the source 116 can be electrically coupled along an entire length of the device, or along periodic contact points along the device length, where the length of the device is into and out of the page of FIG. 2. In these alternative configurations, a gap is cut into the oxide 138 to provide a contact access point to the field plate 132. A gap is cut in the oxide 138 at each desired contact point or region.

The field plate 132 extends over the field oxide filled trench 126 to support high gate-to-drain voltage. The field plate 132 is necessary to maintain the breakdown voltage. If the field plate is removed, for example the entire polysilicon gate portion above the transition region is removed, the breakdown voltage suffers. In this case, almost all the gate-to-drain voltage is dropped across the thin gate oxide, which does not enable the power transistor to meet the rated voltage.

There are three main regions in the substrate 110 relative to the operation of the split gate power transistor: a channel region, a transition region, and a drift region. The channel region is formed underneath the polysilicon gate 130 and in the P-type region 112 of the substrate 110. In other words, the channel region is formed where the polysilicon gate 130 overlaps the P-type region 112. The drift region is the portion of the N-type region 114 underneath the trench 126, or the STI region. The drift region is necessary to support a high gate-to-drain voltage. If the field plate 132 were to instead terminate over the thin gate oxide, this would result in too high a voltage over the gate oxide and the split gate power transistor would not function. As such, the STI region and the field plate extension over the STI region are necessary to drop the high gate-to-drain voltage.

The transition region is the portion of the N-type region 114 underneath the gate oxide 128, the gap 134, and the field plate 132. The transition region provides a current flow path from the channel region to the drift region when the split gate power transistor is turned on. The transition region is also referred to as the accumulation region or the neck region.

Figure 3:
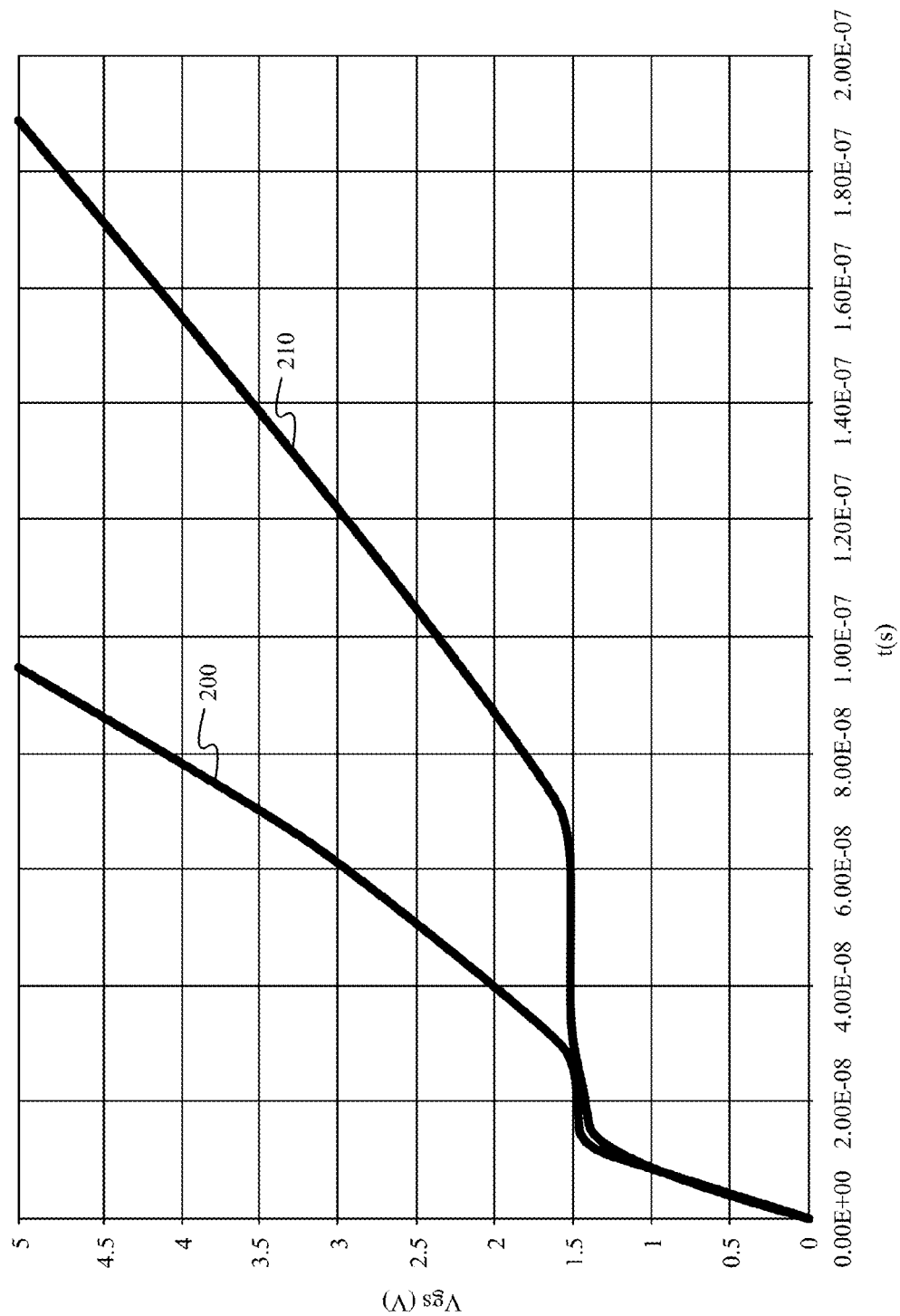
FIG. 3 illustrates a gate charge curve for a conventional power MOSFET, such as that shown in FIG. 1, and the split gate power MOSFET of FIG. 2.

FIG. 3 illustrates a gate charge curve for a conventional power MOSFET, such as that shown in FIG. 1, and the split gate power MOSFET of FIG. 2. The gate charge curve is a common figure of merit for MOSFETs. To determine the gate charge, the drain is connected to a nominal supply voltage through a load resistance, the source is grounded, and the gate is grounded. A constant current is forced into the gate, and the gate-to-source voltage Vgs is measured. As the supply voltage is applied to the gate, the gate-to-source voltage Vgs starts to rise until the threshold voltage is reached, which is 1.5V in this example. The threshold voltage corresponds to the flat portion of the curve, which is where the power transistor begins to turn on. When the gate-to-source voltage Vgs reaches the fully rated voltage, which is 5V in this example, the trace is stopped. The gate charge is determined as the integration of the measured voltage. In the example shown in FIG. 3, the gate charge curves are measured for power MOSFETS having a rated gain-to-source voltage of 5V and an operating voltage of 24V. In general, the operating voltage range is 14V to 60V without having to increase the footprint of the polysilicon that forms the active gate and the field plate of the split gate power transistor.

The curve 200 is the gate charge curve of the split gate power transistor of FIG. 2, and the curve 210 is for a similar conventional power transistor, such as the power transistor of FIG. 1. It is seen in FIG. 3 that the gate charge of the split gate power transistor is reduced by about 50% compared to the conventional power transistor. Reducing the size of the active gate, by removing the slice of polysilicon, reduces the gate charge. It is still necessary to prevent the breakdown of the split gate power transistor, which is accomplished using the field plate. The active polysilicon gate and the field plate are electrically isolated so that the charge that effects the active gate is reduced to the lowest possible level.

It can also be seen that the flat portion of the curve 200 is reduced by approximately 75% compared to the flat portion of the curve 210. The flat portion represents the gate-to-drain charge Qgd, which is the integral of the gate-to-drain voltage across the flat region. Within the flat region, more and more current is forced into the gate, but the gate-to-source voltage remains constant. The gate-to-drain charge Qgd is related to the feedback capacitance between the drain and the gate. In general, the portion of the gate that is positioned over the drain well is amplified and has more of an effect on the gate charge than the portion of the gate that is over the source well. Electrically connecting the field plate to the source, as is done in the split gate power transistor, effectively puts a conductive shield in between the gate and the drain. This reduces the feedback capacitance related to the Miller effect. The reduced flat portion on the gate charge curve reflects this reduction in the feedback capacitance.

The split gate power transistor provides a reduction in the product of on-resistance (R) and gate charge (Qg). An on-resistance of the power MOSFET is the resistance between the drain and the source while the transistor is turned on. However, there is a slight increase in the product of on-resistance (R) and gate area (A), referred to as the specific on-resistance. The specific on-resistance provides a conceptual measure of the size of the power transistor. The specific on-resistance of the split gate configuration rises not due to an increase in the physical gate area A, as the half-pitch of the split gate power transistor having the two polysilicon stripes remains the same as that of the comparable conventional power transistor having a single polysilicon stripe. Instead, the specific on-resistance increases due to an increase in the on-resistance R. When the split gate power transistor is turned completely on, for example when the gate-to-source voltage Vgs=5V, the current flows through the channel region, across the transistor region and the drift region, which is under the field oxide filled trench, and back up to the N+ drain. In the conventional configuration where the polysilicon gate covers the entire transition region, the polysilicon gate above the transition region is at 5V, which accumulates electrons in the transition region. When the gate-to-source voltage Vgs is positive, the transition region is considered accumulated, not inverted. With more electrons accumulated in the transition region, the resistance is reduced. However, in the split gate configuration, a portion of the polysilicon gate over the transition region is removed, and the remaining portion (the field plate) is connected to the source, not the 5V of the active gate. As such, electrons are accumulated in the transition region only in the portion that is directly overlapping with the polysilicon gate. The portion of the transition region that is under the polysilicon field plate and split gap does not accumulate and simply has its natural equilibrium concentration of electrons. As compared to the non-split gate configuration, there are fewer electrons in the transition region, which results in a higher resistance. In an exemplary application, there is an approximate 44% reduction in the R*Qg product, and an approximate 12% increase in the R*A product compared to the comparable conventional power transistor that does not have a split gate configuration, such as the lateral power MOSFET of FIG. 1.

The split gate power transistor also improves the hot carrier lifetime since the grounded field plate directs on-current away from the gate oxide thereby reducing the impact of injected charge on the on-state current flow inside the device. The field plate reduces the electric field for any given supply voltage, which effectively maintains the breakdown voltage of the split gate power transistor. In general, the split gate configuration and field oxide filled trench avoids premature breakdown of the split gate power transistor. In the split gate configuration, the field plate extends over the STI region, and the field plate is electrically connected to the source. The resulting source-to-drain capacitance increases by an amount that is slightly less than the reduction in the gate-to-drain capacitance. So the source-to-drain capacitance is higher, but overall there is an efficiency improvement.

In an exemplary application, the cut gap 134 (FIG. 2) between the polysilicon gate 128 and the field plate 132 is fabricated using 0.18 micron semiconductor processing technology, resulting in a 0.25 micron wide gap. However, the gap can be larger or smaller than 0.25 microns, limited in size only by the available technology. For example, utilization of 0.13 micron semiconductor fabrication technology can achieve a gap width of 0.2 microns. In practice, the gap can be as small as technology allows, thereby minimizing the overall size of the transistor, such as the half-pitch. In general, formation of the split gate power transistor is accomplished without increasing the half-pitch, as compared to a comparable power transistor without the split gate configuration.

The following highlight some of the electrical properties of the split gate power transistor of FIG. 2, especially as compared to a comparable power transistor. First, the on-resistance is slightly higher (about 12% higher for a 24 V device) because the transition region is no longer accumulated when the device is turned on. The field plate is connected to the source so the field plate is grounded, and the transition region does not have as high a concentration of electrons. Second, the gate capacitance and the gate charge are reduced because of smaller gate area. Third, because the source-connected field plate is positioned between the gate and the drain, the gate-to-drain feedback capacitance is greatly reduced. This further reduces the gate charge because during switching, the gate-to-drain capacitance is amplified by the Miller effect. Fourth, peak impact ionization is reduced so that the hot carrier lifetime is improved. Or, for a given hot carrier lifetime, the half-pitch is reduced. Fifth, switch mode power supply (SMPS) efficiency is improved.

The embodiment of the split gate power transistor described above in FIG. 2 provides the aforementioned properties by separating the field plate poly from the gate poly and connecting the field plate to the source. During operation with high drain voltage, an inversion layer of holes builds up under the field plate poly. With thin gate oxide, the voltage drop this inversion layer induces across the gate oxide under the field plate is larger than the maximum permitted for reliable operation. In an exemplary application where the split gate power transistor is rated at 14V operating voltage, there is a 4.1V drop across the gate oxide below the field plate 132 when the drain to source voltage Vds is 14V. Although such a voltage drop is fine for sufficiently thick gate oxides, this voltage drop is much higher than is allowed for reliable 10 year operation for thinner gate oxides, such as 85 A. For a gate oxide thickness of 85 A, for example, a maximum voltage drop across the gate oxide is less than about 3.6V.

A reason for the voltage drop across the gate oxide in the configuration of FIG. 2 is there is an inversion layer of holes under the field plate 132. These holes could be due to thermal generation as seen in a conventional Metal-Oxide-Silicon (MOS) interface.

In some embodiments, this inversion layer of holes is eliminated by implanting a lightly doped region below the gap between the field plate and the polysilicon gate. As applied to the exemplary N-channel configuration shown in FIG. 2, a lightly doped P-type region, also referred to as a P–bridge, is implanted in the N-type region below the gap. This P-type bridge forces the portion of transition region below the field plate 132 to go into deep-depletion with depletion assistance from the inherent P-N junction formed between the P-type bridge and the transition region. Formation of deep-depletion blocks any formation of inversion charge under the field plate thereby relieving the voltage in that area. Maximum gate oxide voltage is reduced to a level safe for use with thinner gate oxides.

Figure 4:
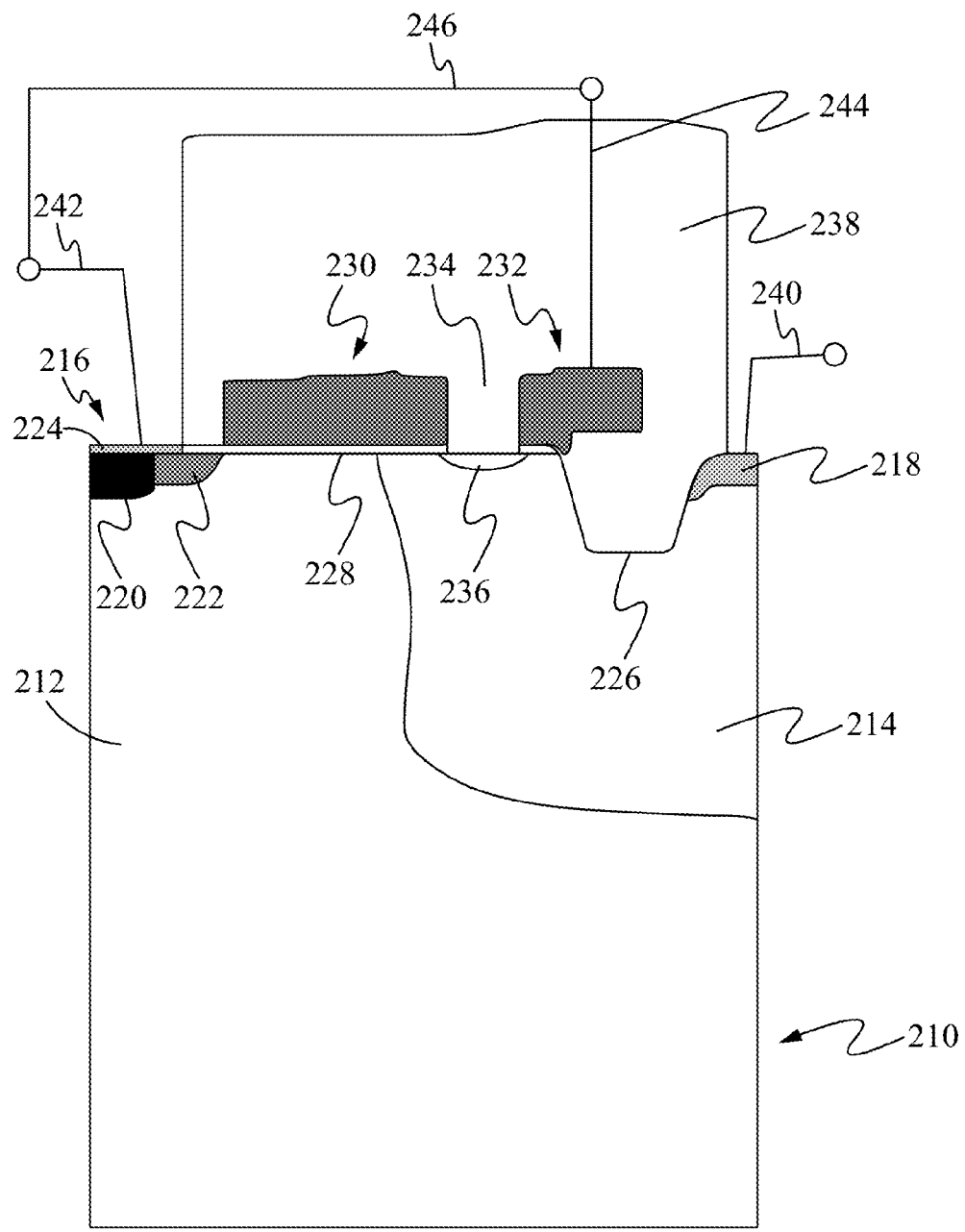
FIG. 4 illustrates a cut-out side view of a split gate laterally-configured power transistor according to another embodiment.

FIG. 4 illustrates a cut-out side view of a split gate laterally-configured power transistor according to another embodiment. The exemplary split gate power converter of FIG. 4 is similar to the split gate power converter of FIG. 2 except that the split gate power converter of FIG. 4 includes a bridge in the substrate portion underneath the gap in the polysilicon gate and field plate. As shown in FIG. 4, the substrate 210 is doped to include a bridge 236. In some embodiments, the bridge 236 is a lightly doped P-type region. The bridge 236 functions to force the portion underneath the field plate 232 into deep-depletion and prevent the formation of an inversion layer. Inclusion of the P-type bridge 236 reduces the electrostatic potential directly underneath the field plate when compared to the split gate power transistor that does not include the bridge, as in FIG. 2. A reduced electrostatic creates a path for the holes away from underneath the field plate, and therefore there is not as large a voltage drop across the gate oxide. In some embodiments, the bridge is implanted. It is understood that other conventional doping techniques can be used, such as diffusion, as long as the technique enables proper application of a lightly doped region. In some embodiments, the bridge is doped using processing steps already performed as part of the power transistor fabrication process. Alternatively, additional processing steps can be performed to customize the doping concentration of the bridge.

Figures 5, 6, 7:
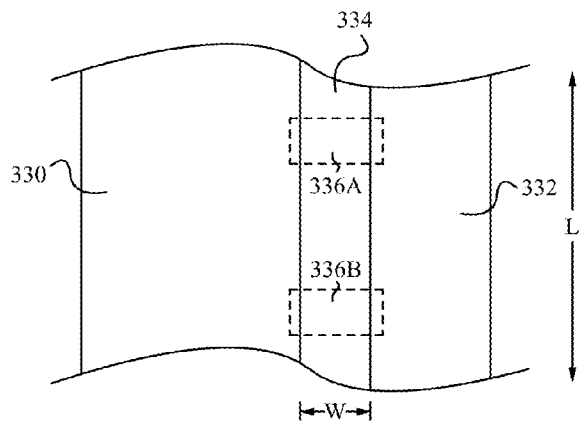
FIG. 5 illustrates a table of characteristics corresponding to comparable power transistors.
FIG. 6 illustrates a top down view of a portion of a split gate power transistor having a discontinuous bridge according to an embodiment.
FIG. 7 illustrates a table of characteristics corresponding to comparable power transistors.

FIG. 5 illustrates a table of characteristics corresponding to comparable power transistors. The first row is directed to a conventional power transistor having a continuous gate, such as the power transistor shown in FIG. 1. The second row is directed to a power transistor having a split gate, such as the split gate power transistor shown in FIG. 2. The third row is directed to a power transistor having a split gate with bridge, such as the split gate power transistor shown in FIG. 4. The column labeled "R*A" is the specific on-resistance, where R is the on-resistance and A is the gate area. The column labeled "ΔR*A" is the percentage change in specific on-resistance relative to the continuous gate power transistor of the first row. The column labeled "$Q_G$" is the gate charge. The column labeled "R*$Q_G$" is the product of the on-resistance and the gate charge. The column labeled "ΔR*$Q_G$" is the percentage change in the on-resistance and gate charge product relative to the continuous gate power transistor of the first row. The column labeled "$BV_{DSS}$" is the breakdown voltage. The column labeled "$V_{OX}$@BV" is the voltage drop across the gate oxide at the breakdown voltage. The column labeled "$V_{OX}$@hot" is the voltage drop across the gate oxide at the worst case hot carrier conditions.

The values shown in the table of FIG. 5 are for simulated power transistors having identical dimensions, each rated at 14V operating voltage. For a power transistor configuration having a gate oxide thickness of 85 A, the maximum rated voltage drop across the gate oxide is 3.6V. As shown in the "$V_{OX}$@BV" column of FIG. 5, the "split" gate power transistor, which has a "$V_{OX}$@BV" of 4.1V is not acceptable. However, either the "continuous" power transistor or the "split with bridge" power transistor would be acceptable for 14V Vds applications. The "split with bridge" power transistor reduces the voltage drop across the gate oxide and therefore can be applied to thinner gate oxide thicknesses. However, despite providing a reduction in gate charge and the R*$Q_G$ product compared to the conventional "continuous" power transistor, the "split with bridge" power transistor has a large specific on-resistance penalty of +30%. For a 30% increase in specific on-resistance, the "split with bridge" power transistor reduces R*$Q_G$ product by 27%.

In an alternative embodiment, the bridge 236 of FIG. 4 is additionally doped with a lightly doped region, such as N-, positioned as a halo between the lightly doped P-type portion and the N-type region 214. In some embodiments, the light doped halo N-type region is implanted. It is understood that other conventional doping techniques can be used, such as diffusion, as long as the technique enables proper application of a lightly doped region. In some embodiments, the doping concentration of the lightly doped P-type portion of the bridge is in the range of about $10^{18}$, and the doping concentration of the lightly doped halo N-type region of the bridge is in the range of about $10^{17}$. Addition of the light doped halo N-type region eliminates the specific on-resistance penalty seen in the split gate with bridge configuration. Referring to the table of FIG. 5, the fourth row is directed to a split gate power transistor having a bridge with the halo. As shown in FIG. 5, the "split with bridge/halo" power transistor actually reduces the specific on-resistance by 3%. The "split with bridge/halo" power transistor additionally reduces gate charge and the $R^*Q_G$ product compared to the "continuous" power transistor, the "split" power transistor, and the "split with bridge" power transistor.

The bridge described in the context of FIG. 5, whether the bridge does or does not include the halo, is configured to be continuous in both the width that spans the gap between the field plate and the gate and the length of the gap. The length of the gap is into and out of the page of FIG. 4. In alternative configurations, the width of the bridge across the gap remains continuous, but the length is discontinuous. For example, 0.25 µm bridges can be disposed every 1-2 µm along the length direction of the gap. The use of discontinuous bridges reduces the specific on-resistance penalty, while still preventing the buildup of a hole inversion layer.

FIG. 6 illustrates a top down view of a portion of a split gate power transistor having a discontinuous bridge according to an embodiment. The exemplary split gate power transistor of FIG. 6 is similar to the split gate power transistor of FIG. 4 except that the bridge of FIG. 4 is replaced by a discontinuous bridge. FIG. 6 shows a portion of a gate 330, a field plate 332, and a gap 334. Two bridge segments 336A and 336B represent the discontinuous bridge. It is understood that the discontinuous bridge can include more than two bridge segments. Each bridge segment 336A, 336B spans an entire width W of the gap 334, but are discontinuous across a length L of the gap 334. Each bridge segment 336A, 336B is similar in composition and function as the bridge 236 of FIG. 4. For example, each bridge segment 336A, 336B can include a lightly doped P-type region or both a lightly doped P-type region and a light doped halo N-type region. In some embodiments, all of the bridge segments are doped the same, for example all are either doped with the lightly doped P-type region or all are doped with both the lightly doped P-type region and the lightly doped halo N-type region. In other embodiments, the bridge segments can be doped differently, for example some bridge segments are doped with the lightly doped P-type region and some of the bridge segments are doped with both the light doped P-type region and the halo N-type region. In other alternative embodiments, the continuous bridge of FIG. 4 can be modified to have discontinuous halo N-type regions. In this configuration, the gap length has a continuous lightly doped P-type region along the entire length of the gap, and segments of the bridge also include the halo N-type region.

The discontinuous bridge prevents the formation of a hole inversion layer underneath the field plate, but without the specific on-resistance penalty of the split gate with continuous bridge configuration. FIG. 7 illustrates a table of characteristics corresponding to comparable power transistors. The table of FIG. 7 shows the "continuous" power transistor, the "split" power transistor, and the "split with bridge" power transistor similarly shown in the table of FIG. 5 plus the "split with discontinuous bridges" power transistor corresponding to the split gate power transistor of FIG. 6. Although similar, the results shown in FIG. 7 are not intended to be compared to the results of FIG. 5, as each represents a separate simulation. The values of the "split with discontinuous bridges" power transistor shown in FIG. 7 correspond to a discontinuous bridge having bridge segments of the lightly doped P-type region, but no halo N-type region. Each bridge segment has a 0.25 µm length on a 1.5 µm pitch. As shown in the R*L column of FIG. 7, instead of the 24% specific on-resistance penalty of the "split with bridge" power transistor compared to the "split" power transistor, the penalty is much lower for the "split with discontinuous bridge" power transistor. One-sixth of the device L has R*L product that is 24% higher than the rest, so the resistance per unit length is only 3.4% higher than the device with no bridge at all. The "split with discontinuous bridges" power transistor has a 36% reduction in the $R^*Q_G$ product with only a 9% specific on-resistance penalty compared to the "continuous" gate power transistor.

In general, the discontinuous bridge without the bridge halo configuration provides the benefits of the continuous bridge configuration with the bridge halo.

In the presented embodiments, the bridge or bridge segments are floating. In other words, the bridge is not coupled to a contact. In other embodiments, the bridge or bridge segments are coupled to a contact. The contact can be coupled to ground or to a potential.

Alternative embodiments are contemplated for eliminating the inversion layer of holes described above. In one such embodiment, the field plate is positioned completely over the field oxide within the STI region, thereby exposing the top corner of the N-type region bordering the STI region. This configuration substantially eliminates the inversion layer of holes and the resulting excessive gate oxide voltage, whereby maximum gate oxide voltage is reduced to a level safe for use with thinner gate oxides. However, a device with the field plate completely over field oxide has a fast increase in on-resistance during hot carrier stress, for example +12% after 60 seconds. Most of this increase disappears after a few hundred seconds relaxation time. The hot carrier reliability of the split gate power transistor with the field plate on the STI region can be increased by filling the active area between the end of the polysilicon gate and the edge of the STI region with a low-dose, low-energy P-type implant, for example a PMOS LDD. Adding such a P-type fill implant substantially reduces if not eliminates the effect of fast states on hot carrier aging in at least two ways. First, hot electrons are kept away from the top corner of the N-type region bordering the STI region by the retarding field at the P-N junction. Second, the conducting transition region of the split gate power transistor is effectively shielded from charging and discharging of fast states in the field oxide by the quasi-neutral P-type fill implant. This reduces the electric field in the vicinity of the STI region that borders the N-type region, thereby making the STI region at the border less prone to injection. Even with the reduced occurrence of injection, the injection that does occur is less influential on the on-state current because the electrons are kept away from the top corner of the N-type region bordering the STI region. A disadvantage of adding the P-type fill implant is increased on-resistance from depletion into the transition region. To mitigate this, the end of the polysilicon gate is moved as close as possible to the edge of the STI region without significantly increasing the gate charge.

Figure 8:
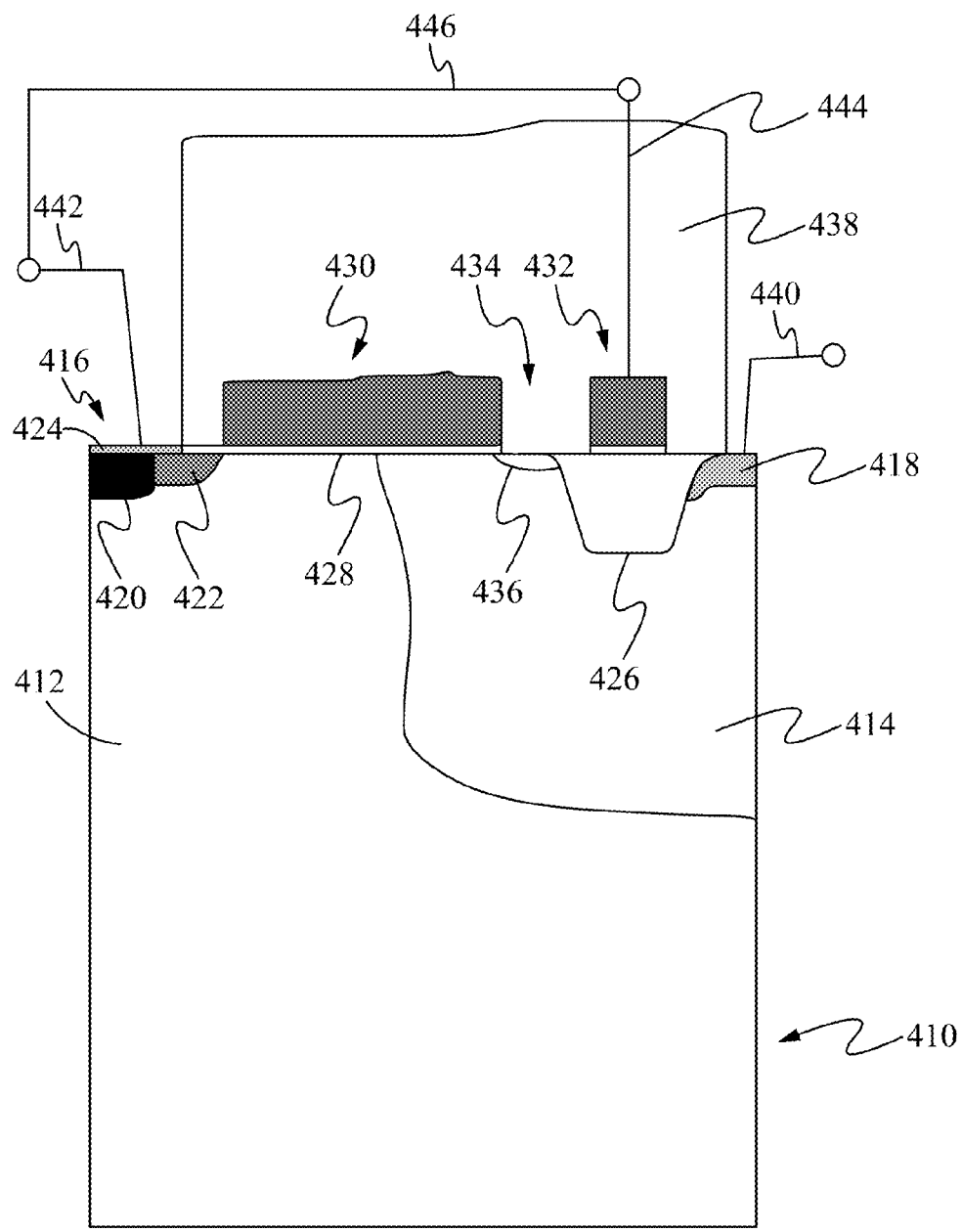
FIG. 8 illustrates a cut-out side view of a split gate laterally-configured power transistor according to another embodiment.

FIG. 8 illustrates a cut-out side view of a split gate laterally-configured power transistor according to another embodiment. The exemplary split gate power transistor of FIG. 8 is similar to the split gate power converter of FIG. 4 except that the split gate power transistor of FIG. 8 has the field plate 432 positioned entirely over the STI region 426, and a P-type fill region 436 is positioned underneath the gap 434 and adjacent to the STI region 426. In contrast to the split gate power transistor with bridge shown in FIG. 4, the split gate power transistor with the fill region adjacent to the STI region has only a single transition region. In some embodiments, the edge of the polysilicon gate 430 is 0.1-0.5 microns from the edge of the STI region 426, and the edge of the field plate 432 is similarly spaced from the edge of the STI region 426. The width of the polysilicon gate 430 is wider than the polysilicon gate 230 in FIG. 4. As shown in FIG. 8, the substrate 410 is doped to include the P-type fill region 436. The P-type fill region 436 prevents hot electrons from reaching the top edge of the STI region 426. The conducting transition region underneath the polysilicon gate 430 is effectively shielded from charging and discharging of fast states in the field oxide by the quasi-neutral P-type fill region 436. The result is a reduction in the voltage across the gate oxide 428. In some embodiments, the P-type fill region 436 is implanted. It is understood that other conventional doping techniques can be used, such as diffusion, as long as the technique enables proper application of a doped region. In some embodiments, the P-type fill region is doped using processing steps already performed as part of the power transistor fabrication process. Alternatively, additional processing steps can be performed to customize the doping concentration of the P-type fill region.

FIG. 9 illustrates a table of characteristics corresponding to comparable power transistors. The first row is directed to a conventional power transistor having a continuous gate, such as the power transistor shown in FIG. 1. The second row is directed to a power transistor having a split gate, such as the split gate power transistor shown in FIG. 2. The third row and the fourth row are directed to a power transistor having a split gate with the field plate positioned over the STI region and a P-type fill region, such as the split gate power transistor shown in FIG. 8. The third row specifies a P-type fill region, labeled as "POR PLDD5 fill", that is formed using processing steps already performed as part of the power transistor fabrication process. The values shown in the third row of FIG. 9 are for a simulated split gate power transistor having a P-type fill region dose of 1.8E13. The fourth row specifies a P-type fill region, labeled as "Rec PLDD5 fill", that is formed using additional processing steps performed to customize the doping concentration. The values shown in the fourth row of FIG. 9 are for a simulated split gate power transistor having a P-type fill region dose of 5.0E13.

The column labeled "R*W" is the product of the on-resistance R and the gate width W. The column labeled "R*A" is the specific on-resistance, where A is the gate area. The column labeled "ΔR*A" is the percentage change in specific on-resistance relative to the continuous gate power transistor of the first row. The column labeled "$Q_G$" is the gate charge. The column labeled "R*$Q_G$" is the product of the on-resistance and the gate charge. The column labeled "ΔR*$Q_G$" is the percentage change in the on-resistance and gate charge product relative to the continuous gate power transistor of the first row. The column labeled "$BV_{DSS}$" is the breakdown voltage. The column labeled "$V_{OX}$@BV" is the voltage drop across the gate oxide at the breakdown voltage. The column labeled "$V_{OX}$@hot" is the voltage drop across the gate oxide at the worst case hot carrier conditions.

The values shown in the table of FIG. 9 are for simulated power transistors having similar dimensions, each rated at 36V operating voltage and having breakdown voltage $BV_{DSS}$ in or around 50V. For a power transistor configuration having a gate oxide thickness of 85 A, the maximum rated voltage drop across the gate oxide is 3.6V. As shown in the "$V_{OX}$@BV" column of FIG. 9, the "split over active" gate power transistor in row three, which has a "$V_{OX}$@BV" of 3.4V, is not acceptable. However, either the "POR PLDD5 fill" power transistor or the "Rec PLDD5 fill" power transistor would be acceptable for 36V Vds applications. The "POR PLDD5 fill" power transistor reduces the voltage drop across the gate oxide and therefore can be applied to thinner gate oxide thicknesses. However, despite providing a reduction in gate charge and the R*$Q_G$ product compared to the conventional "continuous" power transistor, the "POR PLDD5 fill" power transistor has a large specific on-resistance penalty of +44% and a reduction in breakdown voltage $BV_{DSS}$ of 9V. For a 44% increase in specific on-resistance and 9V decrease in breakdown voltage $BV_{DSS}$, the "POR PLDD5 fill" power transistor reduces R*$Q_G$ product by 13%. The "Rec PLDD5 fill" power transistor provides only a 9% increase in specific on-resistance, while reducing $Q_G$ per unit width by 40% and the R*$Q_G$ product by 32% compared to the "continuous" power transistor. Even more improvement can be expected using a halo implant to reduce depletion into the transition region.

Similarly to the bridge of FIG. 4, the P-type fill region can be additionally doped with a lightly doped region, such as N-, positioned as a halo between the P-type fill portion and the N-type region 414. In some embodiments, the lightly doped halo N-type region is implanted. It is understood that other conventional doping techniques can be used, such as diffusion, as long as the technique enables proper application of a lightly doped region. In an exemplary application, the doping level of the lightly doped halo N-type region is approximately 5.0E13. Addition of the light doped halo N-type region further minimizes the specific on-resistance penalty seen in either the "POR PLDD5 fill" power transistor or the "Rec PLDD5 fill" power transistor.

The P-type fill region described in the context of FIG. 8, whether the P-type fill region does or does not include the halo, is configured to be continuous in both the width that spans the gap between the polysilicon gate and the STI region, and the length of the gap. The length of the gap is into and out of the page of FIG. 8. In alternative configurations, the width of the P-type fill region across the gap remains continuous, but the length is discontinuous. For example, 0.1 μm wide P-type fill region segments can be disposed every 1-2 μm along the length direction of the gap. The use of a discontinuous P-type fill region, reduces the specific on-resistance penalty, while still preventing the buildup of a hole inversion layer. This configuration using a discontinuous P-type fill region is conceptually similar to the discontinuous bridge described above and shown in FIG. 6. Each P-type fill region segment can include a P-type region or both a P-type region and a halo N-type region. In some embodiments, all of the P-type fill region segments are doped the same, for example all are either doped with the P-type region or all are doped with both the P-type region and the halo N-type region. In other embodiments, the P-type fill region segments can be doped differently, for example some P-type fill region segments are doped with the P-type region and some of the P-type fill region segments are doped with both the P-type region and the halo N-type region. In other alternative embodiments, the continuous P-type fill region of FIG. 8 can be modified to have discontinuous halo N-type regions. In this configuration, the gap length has a continuous P-type fill region along the entire length of the gap, and segments of the P-type fill region also include the halo N-type region.

In the presented embodiments, the P-type fill region or P-type fill region segments are floating. In other words, the P-type fill region is not coupled to a contact. In other embodiments, the P-type fill region or P-type fill region segments are coupled to a contact. The contact can be coupled to ground or to a potential.

In those embodiments where the bridge or fill region is floating, this region charges and discharges during switching operation of the device. This may impact device performance. Alternative embodiments may be used to prevent formation of the hole inversion layer underneath the field plate, but without using a bridge or fill region within the substrate. An alternate embodiment eliminates the formation of a floating region within the substrate and instead inserts one or more minimum size tabs, or body extension regions, attached to the main body region such that the body extension region extends to at least the edge of the field plate. Such an extension can be of minimum geometry, independent of device length and can be placed anywhere along the length of the device. In some embodiments, the body extension region is positioned in the length-wise center of the device. In some embodiments, more than one body extension region can be included. Introduction of the body extension region provides an effective sink for the hole inversion charge that attempts to form under the field plate and forces that region to go into deep-depletion, thereby moving the voltage and high electric field away from the thin-gate oxide.

A disadvantage of the bridge or fill region embodiments is the associated increase in the on-resistance of the device due to the extra constriction introduced into the device transition region. Additionally, insertion of the bridge or fill region causes a drop in the breakdown voltage for higher voltage devices, such as greater than about 40V. To address this issue, the dose of the bridge or fill region can be adjusted, but this may require a new implant using additional processing steps. A split gate power transistor having a body extension region instead of a bridge or fill region eliminates the extra constriction in the transition region, resulting in a decreased on-resistance compared to those configurations having the bridge or fill region. Since power devices are typically constructed in large size and gate length, a minimum geometry body extension implant does not register as a significant device performance degradation. For example, a device with gate length of 100 um and a body extension region having a length of 0.7 um registers no more than 0.7% increase in on-resistance.

Figure 10:
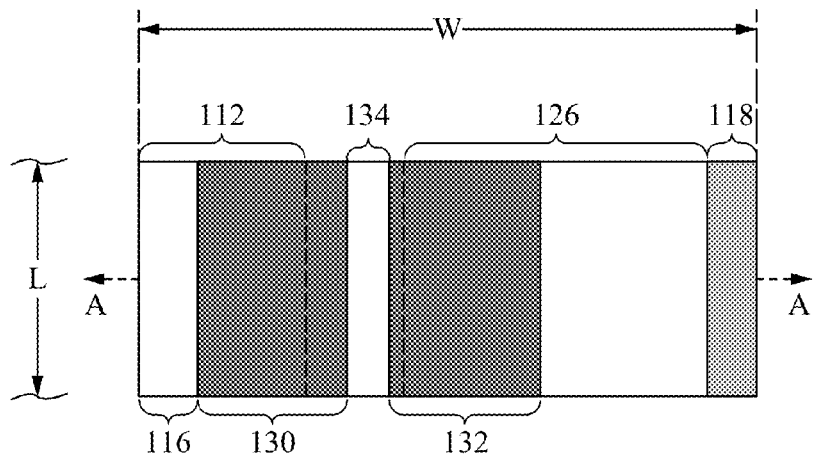
FIG. 10 illustrates a top down view of a portion of the length of the split gate power transistor of FIG. 2.
Figure 11:
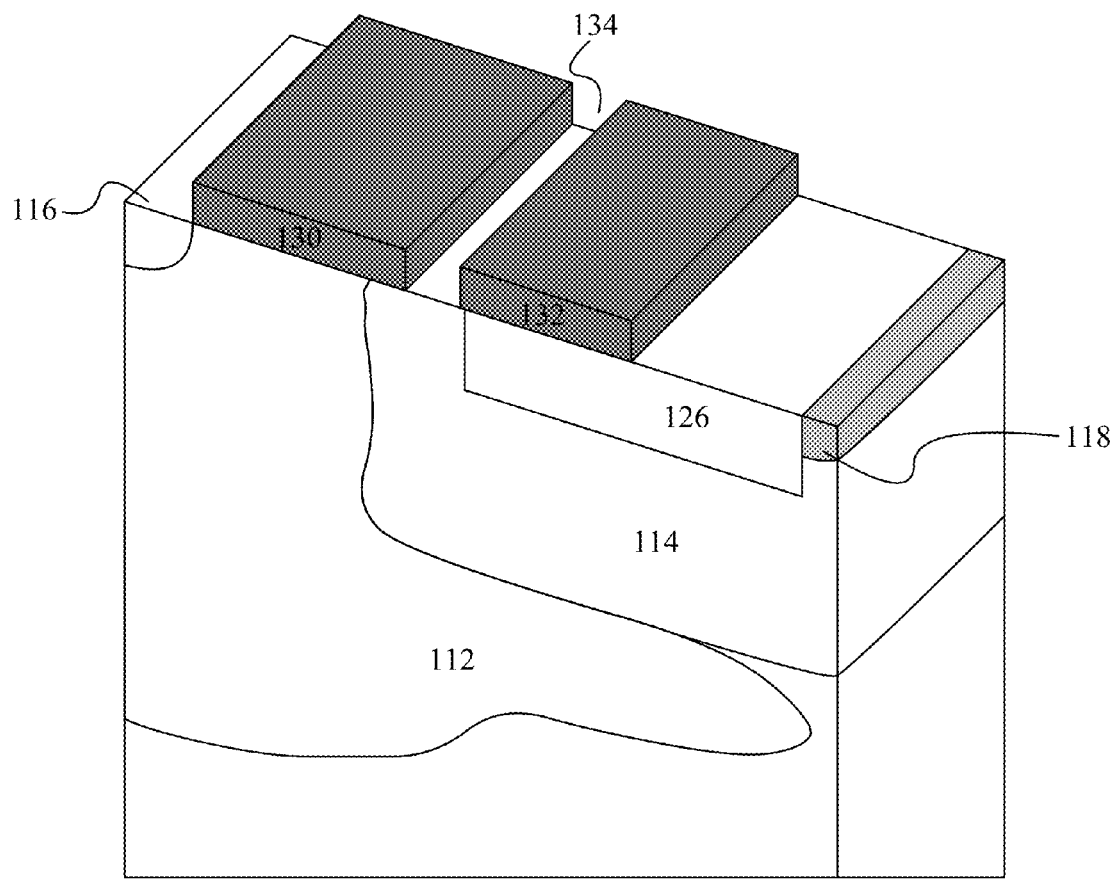
FIG. 11 illustrates a perspective view of the split gate power transistor of FIG. 10 cut-out along the line A-A.

To better understand the use of a body extension region, a more detailed look at the split gate power transistor of FIG. 2 is first provided. FIG. 10 illustrates a top down view of a portion of the length of the split gate power transistor of FIG. 2. FIG. 11 illustrates a perspective view of the split gate power transistor of FIG. 10 cut-out along the line A-A. It is understood that the figure dimensions are for illustrative purposes only and that the dimensions are not necessarily shown to scale and do not exactly correspond to the dimensions shown in FIG. 2. The exemplary split gate power transistor of FIGS. 10 and 11 shows the relative positions of the source 116, the body substrate 112, the polysilicon gate 130, the gap 134, the field plate 132, the trench 126, and the drain 118. The gap 134 extends along the length of the device, and the entire length of the gap 134 is positioned over the N-type region 114. A portion of the field plate 132 overlaps a portion of the transition region in the N-type region 114. The hole inversion layer forms within this overlap portion of the transition region, underneath the overlap portion of the field plate 132.

Figure 12:
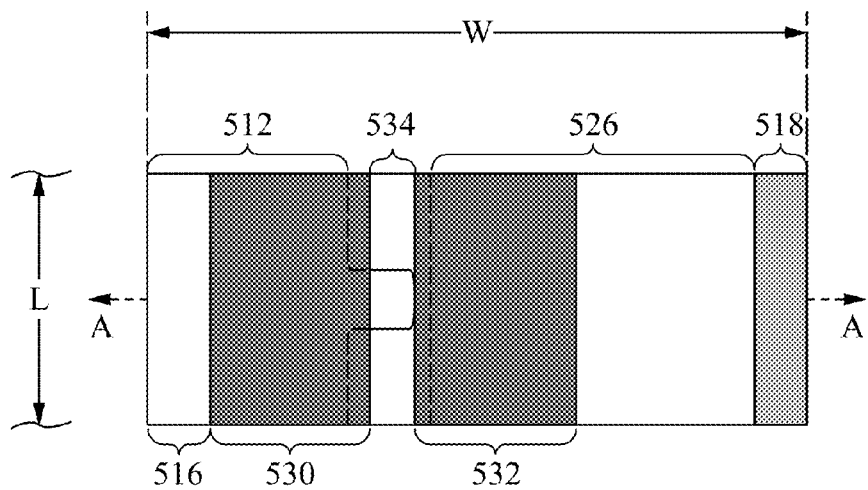
FIG. 12 illustrates a top down view of a portion of a length of a split gate power transistor having a body extension region according to an embodiment.
Figure 13:
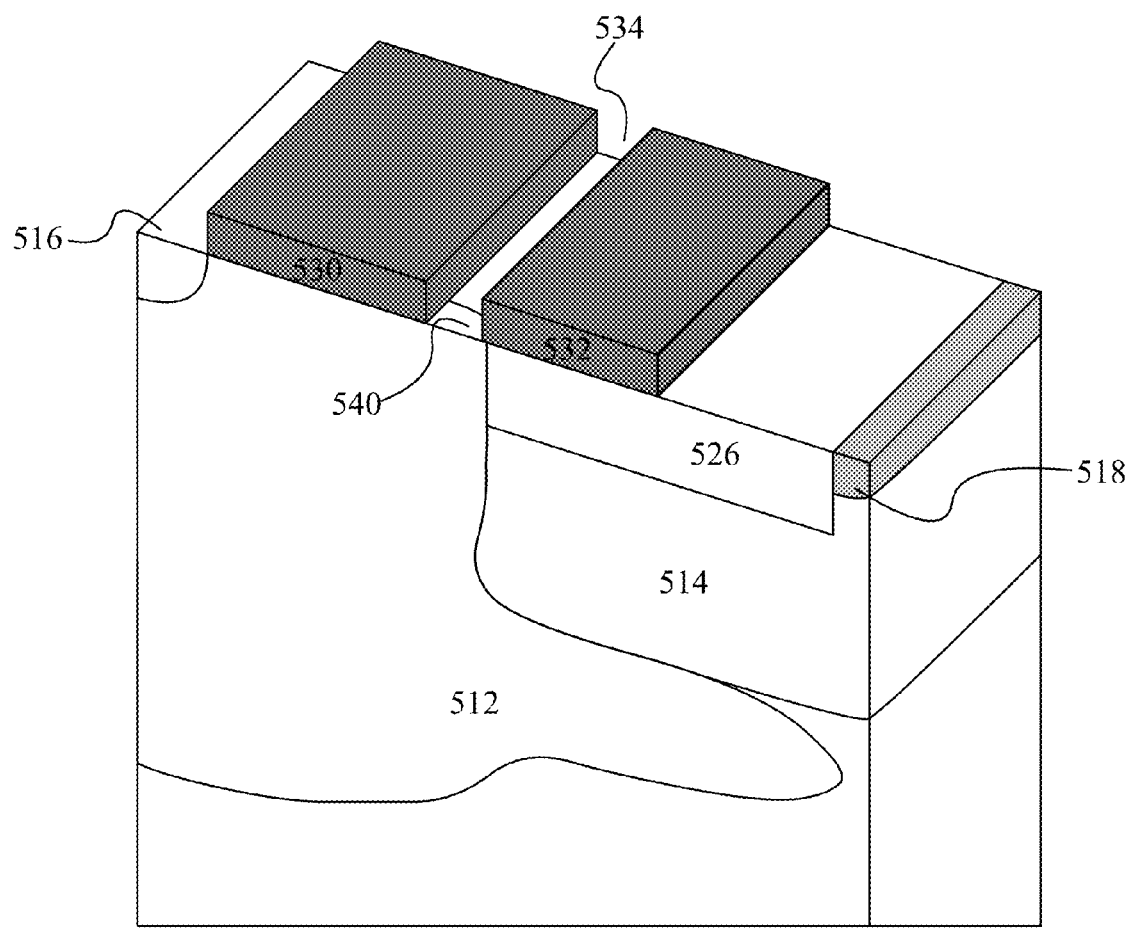
FIG. 13 illustrates a perspective view of the split gate power transistor of FIG. 12 cut-out along the line A-A.

To prevent the formation of the hole inversion layer, the substrate is alternatively doped to include one or more body extension regions along the length of the device, underneath the gap. FIG. 12 illustrates a top down view of a portion of a length of a split gate power transistor having a body extension region according to an embodiment. FIG. 13 illustrates a perspective view of the split gate power transistor of FIG. 12 cut-out along the line A-A. The top down view shown in FIG. 12 is similar to that shown in FIG. 10 with the addition of a body extension region 540. The exemplary split gate power transistor of FIGS. 12 and 13 shows the relative positions of the source 516, the body substrate 512, the polysilicon gate 530, the gap 534, the field plate 532, the trench 526, and the drain 518. The gap 534 extends along the length of the device. The body extension region 540 is a P-type region that extends from the P-type body substrate 512 to at least the edge of the field plate 532. As shown in FIGS. 12 and 13, the body extension region 540 extends to the edge of the trench 526. Lengthwise, a portion of the gap is positioned over the body extension region 540, while the remaining length of the gap 534 is positioned over the N-type region 514. A portion of the field plate 532 overlaps a portion of the substrate. In those cross-sectional areas that do not include the body extension region, the field plate 532 overlaps with a portion of the N-type region 514. In those cross-sectional areas that do include the body extension region 540, the field plate 532 overlaps with a portion of the body extension region 540.

In some embodiments, the body extension region is formed as part of the body substrate implant. In this case, the shape of the body substrate implant is adjusted to include the dimensions of the body extension region. In an example, the shape of the body substrate implant corresponding to the P-type region 112 of FIG. 2 is changed to add the shape of the body extension region 540 to the P-type region 112. In other embodiments, the body extension region is formed using a different implant step from the body substrate implant.

Figure 14:
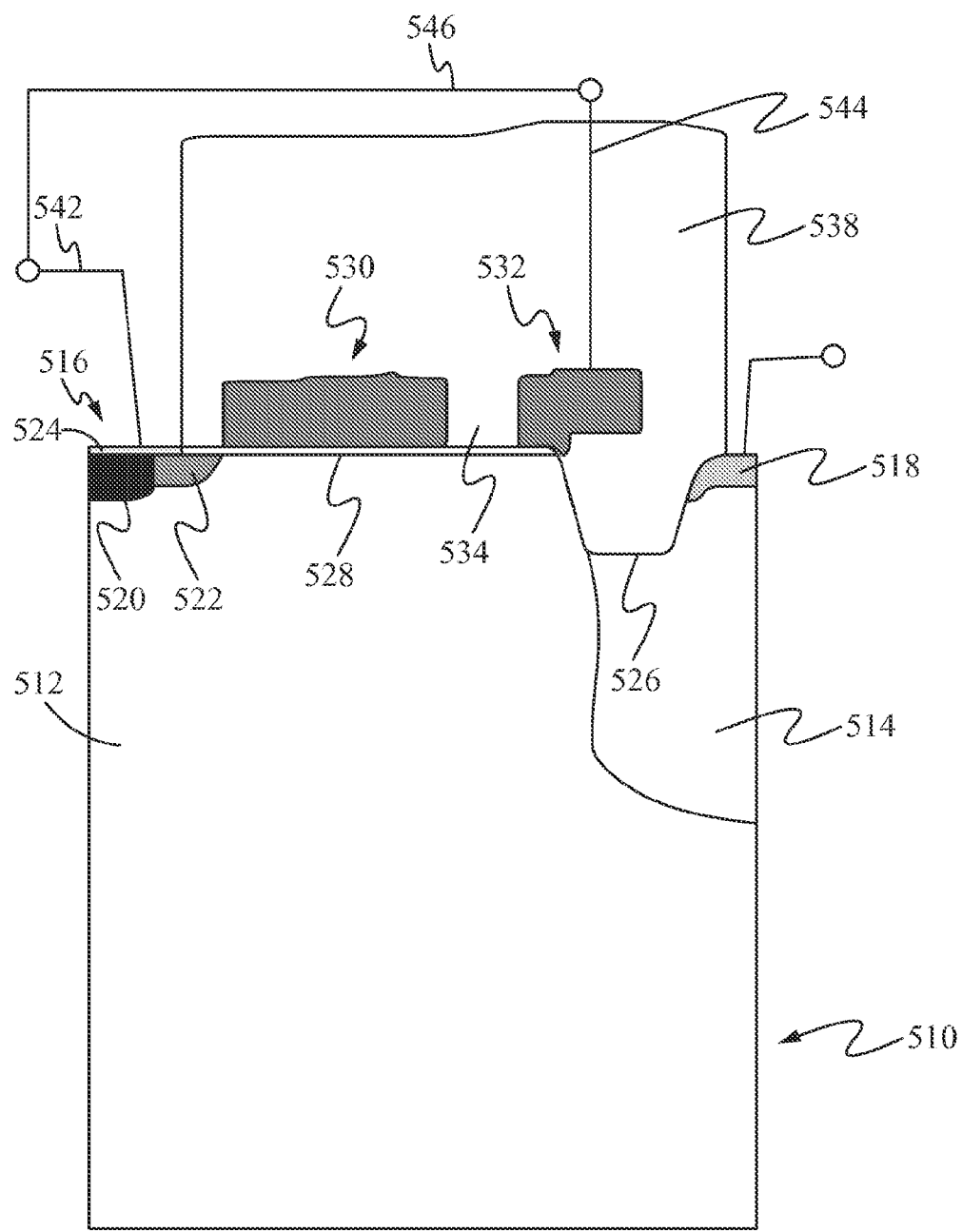
FIG. 14 illustrates a cut-out side view of the split gate power transistor along the body extension region according to an embodiment.

FIG. 14 illustrates a cut-out side view of the split gate power transistor along the body extension region according to an embodiment. The split gate power transistor has a cross-section similar to that of FIG. 14 when the cross-section is taken along the body extension region, whereas the split gate power transistor has a cross-section similar to that of FIG. 2 when the cross-section is not taken along the body extension region. It is understood that the dimensions shown in the figures are for illustrative purposes only and that the dimensions are not necessarily shown to scale and do not necessarily correlate from one figure to the next.

As shown in FIGS. 12-14, the body extension region 540 extends to the edge of the trench 526. In alternative embodiments, the body extension region does not have to extend all the way to the trench. In some embodiments, the body extension region extends to the edge of the field plate 532. In other embodiments, the body extension region extends beyond the edge of the field plate 532, but not all the way to the trench 526.

Embodiments of the split gate power transistor having a body extension region are described above as including a single body extension region substantially centered about the length of the device. Alternatively, the body extension region does not have to be centrally positioned along the length, and instead can be positioned anywhere along the length of the device. Further, the split gate power transistor can include more than one body extension region.

Instead of configuring a split gate power transistor with a body extension region, the split gate power transistor can alternatively be configured with one or more minimum geometry polysilicon extension tabs connected to the field plate and extending to at least an edge of the body substrate. A portion of the gate is removed corresponding to the location of the polysilicon extension tab so that the polysilicon extension tab is physically and electrically isolated from the gate. Similarly to the split gate power transistor with body extension region, the split gate power transistor with polysilicon extension tab eliminates the extra constriction in the transition region, resulting in a decreased on-resistance compared to those configurations having the bridge or fill region. Such a polysilicon extension tab can be of minimum geometry, independent of device length and can be placed anywhere along the length of the device. In some embodiments, the polysilicon extension tab is positioned in the length-wise center of the device. In some embodiments, more than one polysilicon extension tab can be included. Introduction of the polysilicon extension tab provides an effective sink for the hole inversion charge that attempts to form under the field plate and forces that region to go into deep-depletion, thereby moving the voltage and high electric field away from the thin-gate oxide. Since power devices are typically constructed in large size and gate length, a minimum geometry cut in the gate to accommodate the polysilicon extension tab does not register as a significant device performance degradation. For example, a device with gate length of 100 um and a cut in the gate of 0.5 um registers no more than 0.5% increase in on-resistance.

Figure 15:
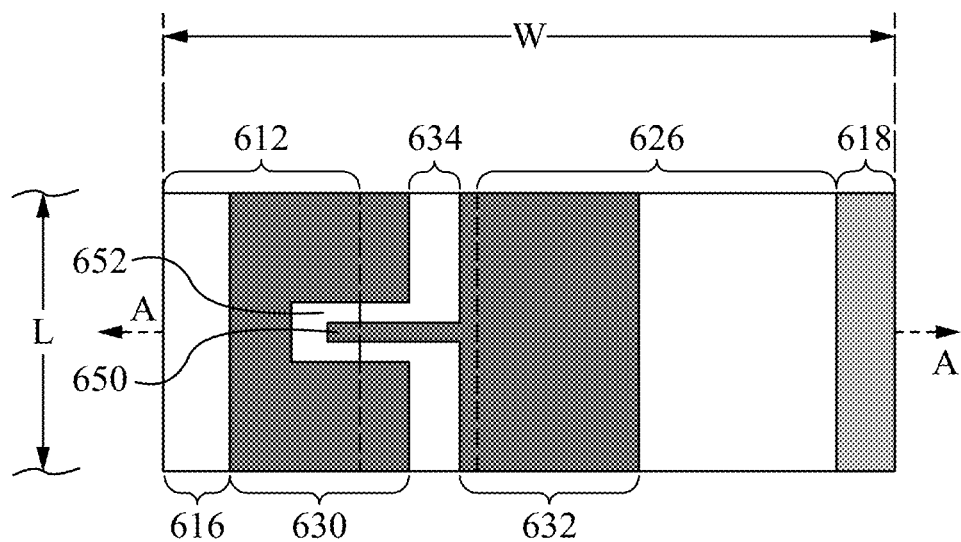
FIG. 15 illustrates a top down view of a portion of a length of a split gate power transistor having a polysilicon extension tab according to an embodiment.

To prevent the formation of the hole inversion layer, the substrate is doped similarly as the split gate power transistor of FIG. 2, but the polysilicon layer is configured to include a gate with a cut-out portion, a field plate, and a polysilicon extension tab connected to the field plate. FIG. 15 illustrates a top down view of a portion of a length of a split gate power transistor having a polysilicon extension tab according to an embodiment. The top down view shown in FIG. 15 is similar to that shown in FIG. 10 with the addition of a polysilicon extension tab 650 and a cut-out region 652. The exemplary split gate power transistor of FIG. 15 shows the relative positions of the source 616, the body substrate 612, the polysilicon gate 630, the gap 634, the field plate 632, the trench 626, and the drain 618. The gap 634 extends along the length of the device. The polysilicon extension tab 650 is a polysilicon extension connected at one end to the field plate 632. The cut-out region 652 is formed by removing a portion of the polysilicon gate 630. The cut-out region 652 is aligned to accommodate the polysilicon extension tab 652 and provide a minimum gap between the polysilicon extension tab 652 and the polysilicon gate 630 to provide physical and electrical isolation between the two. In some embodiments, the cut-out region 652 is formed through the entire width of the polysilicon gate 630. In this case, the polysilicon gate is split into two separate segments. It is necessary that both segments are electrically connected. In some embodiments the two separate polysilicon gate segments are connected via metal. In other embodiments, the two separate polysilicon gate segments are connected via one or more additional polysilicon layers.

In other embodiments, the cut-out region is formed through only a portion of the polysilicon gate width. In this case, a notch is formed in the polysilicon gate so as to accommodate the polysilicon extension tab. The length and width of the notch must be sufficient to allow the polysilicon extension tab to extend at least to the body substrate and to provide physical and electrical isolation between the polysilicon gate and the polysilicon extension tab. In an exemplary application, the edge of the polysilicon extension tab is separated from the edge of the polysilicon gate by at least 0.2 microns, and the length of the polysilicon gate tab is approximately 0.2 microns. It is understood that other dimensions can be used.

The polysilicon extension tab 650 extends from the field plate 632 to at least the edge of the body substrate 612. In some embodiments, the body extension tab 652 extends to the edge of the body substrate 612. In other embodiments, the polysilicon extension tab 652 extends over a portion of the body substrate 612. In still other embodiments, the polysilicon extension tab 652 extends over the body substrate 612 to the source 616, thereby overlapping the entire width of the channel region. In those embodiments where the polysilicon gate is cut through its entire width, the polysilicon extension tab may or may not extend the entire width of the polysilicon gate.

Figure 16:
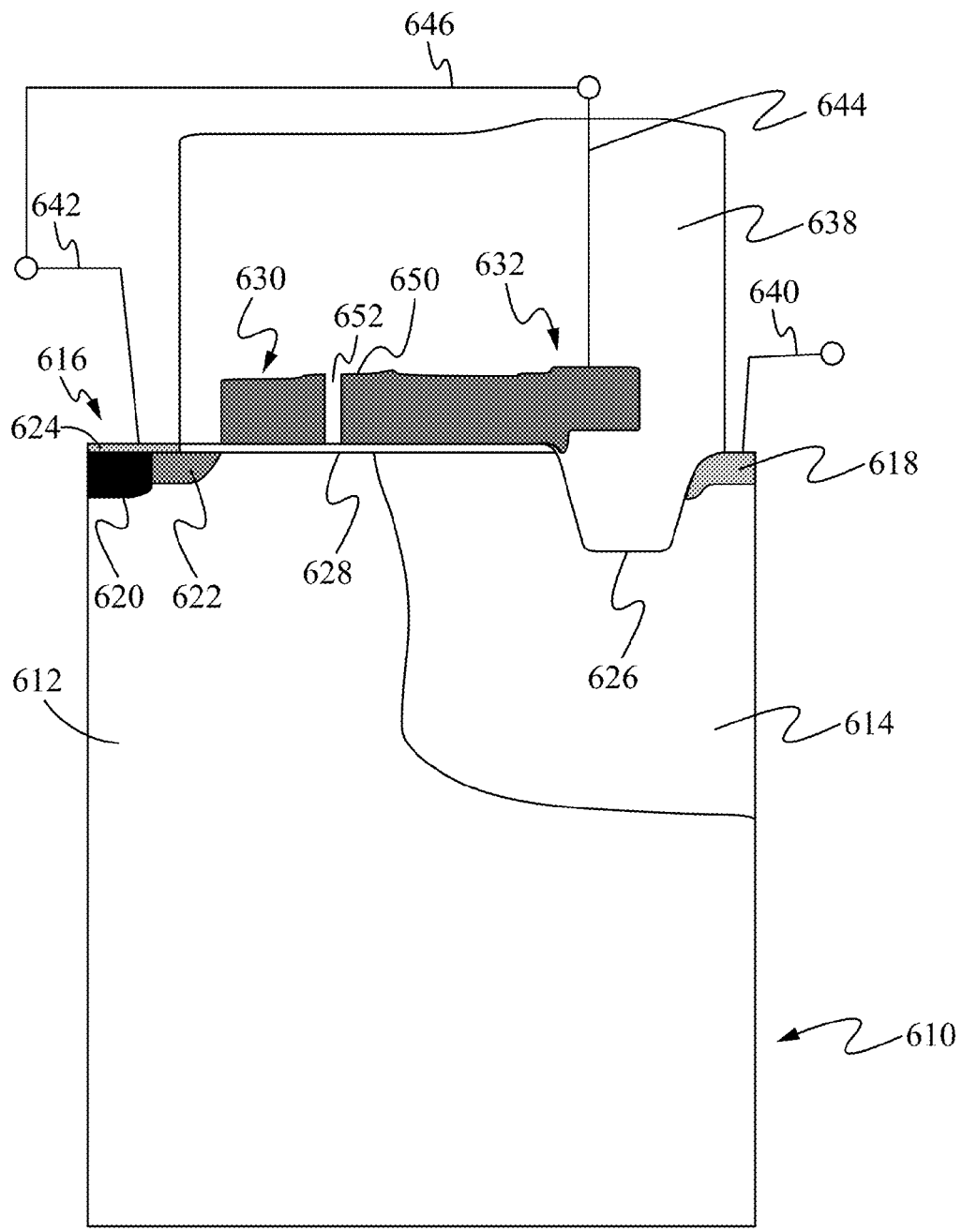
FIG. 16 illustrates a cut-out side view of the split gate power transistor of FIG. 15 cut-out along the polysilicon extension tab according to an embodiment.

As shown in FIG. 15, the polysilicon extension tab 650 extends past the edge of the body substrate 612 so as to form a partial overlap with the body substrate 612. FIG. 16 illustrates a cut-out side view of the split gate power transistor of FIG. 15 cut-out along the polysilicon extension tab according to an embodiment. It is understood that the dimensions shown in the figures are for illustrative purposes only and that the dimensions are not necessarily shown to scale and do not necessarily correlate from one figure to the next. Widthwise, a portion of the polysilicon extension tab 650 is positioned over the body substrate 612, while the remaining portion of the polysilicon extension tab 650 is positioned over the N-type region 614. A portion of the cut-out region 652 is positioned over the body substrate 612, while the remaining portion of the cut-out region 652 is positioned over the N-type region 614. A portion of the field plate 632 overlaps a portion of the N-type region 614.

Embodiments of the split gate power transistor having a polysilicon extension tab are described above as including a single polysilicon extension tab substantially centered about the length of the device. Alternatively, the polysilicon extension tab does not have to be centrally positioned along the length, and instead can be positioned anywhere along the length of the device. Further, the split gate power transistor can include more than one polysilicon extension tab.

Embodiments of the split gate power transistor are described above as using means for driving the portion of the transition region underneath the field plate into deep-depletion in order to prevent the formation of the hole inversion layer. The split gate power transistor with body extension region and the split gate power transistor with polysilicon extension tab can be implemented separately, as described above. It is understood that the two techniques can be combined to form a split gate power transistor that includes both one or more body extension regions and one or more polysilicon extension tabs.

Embodiments of the split gate power transistor are described above as N-channel MOSFETs. Alternative embodiments are also contemplated, for example a P-channel MOSFET. Application to a P-channel MOSFET requires a slightly different configuration. Alternative configurations can be implemented where the split gate power transistor is configured with all aspects having opposite polarities than those shown in the described embodiments.

The gate material is described above as being polysilicon. Alternatively, the gate can be made of any conventional material used in the fabrication of semiconductor transistors including, but not limited to, polysilicon and/or metal. The substrate is described above as being silicon. Alternatively, the substrate can be a silicon-based compound, for example silicon germanium (SiGe).

The present application has been described in terms of specific embodiments incorporating details to facilitate the understanding of the principles of construction and operation of the split gate power transistor. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A power transistor comprising:
   a. a doped substrate comprising a source and a channel region within a first doped region, and a drain, a transition region, and a trench within a second doped region, wherein the trench is formed in a first surface of the substrate and the trench is filled with an insulating material, further wherein along a width of the substrate the channel region is positioned between the source and the transition region, the transition region is positioned between the channel region and the trench, and the trench is positioned between the transition region and the drain;
   b. a gate oxide layer positioned on the first surface of the substrate;
   c. a gate having a gate width and a gate length, wherein the gate is positioned on the gate oxide layer and the gate width is aligned over the channel region and a first portion of the transition region, further wherein the gate includes one or more cut-out regions along the gate length;
   d. a field plate having a field plate width and a field plate length, wherein the field plate is positioned on the gate oxide and the field plate width is aligned over a second portion of the transition region and over a portion of the trench, further wherein a gap having a gap width and a gap length is formed between the gate and the field plate, the gate and the field plate are separated by the gap width, further wherein the field plate is electrically coupled to the source via a conductive trace; and
   e. one or more extension tabs coupled to the field plate along the field plate length, each extension tab is aligned with one of the cut-out regions and extends toward the gate to at least above an edge of the first doped region of the substrate.

2. The power transistor of claim 1 wherein each extension tab comprises a first end coupled to the field plate and a second end positioned within one of the cut-out regions in the gate, further wherein each extension tab is physically and electrically isolated from the gate.

3. The power transistor of claim 1 wherein one or more of the cut-out regions extends the gate width, thereby splitting the gate into separate gate segments.

4. The power transistor of claim 3 further comprising one or more metal layers coupled to each separate gate segment to electrically couple together all of the separate gate segments.

5. The power transistor of claim 3 further comprising one of more polysilicon layers coupled to each separate gate segment to electrically couple together all of the separate gate segments.

6. The power transistor of claim 1 wherein one or more of the cut-out regions extends a partial distance of the gate width.

7. The power transistor of claim 1 wherein a ratio of a length of the extension tab to the gate length is less than or equal to 1:50.

8. The power transistor of claim 1 wherein the gate, the field plate, and the one or more extension tabs comprise polysilicon.

9. The power transistor of claim 1 wherein the first doped region is a P-type region and the second doped region is a N-type region.

10. The power transistor of claim 1 wherein the power transistor comprises a lateral double-diffused metal-oxide-semiconductor field-effect transistor.

11. The power transistor of claim 1 wherein the doped substrate further comprises a drift region within the second doped region, wherein the drift region is positioned under the trench.

12. The power transistor of claim 1 further comprising a conductive drain terminal coupled to the drain and a conductive source terminal coupled to the source, wherein the source terminal is coupled to the field plate via the conductive trace.

13. The power transistor of claim 1 wherein the substrate comprises a silicon substrate.

14. The power transistor of claim 1 where the source comprises a double-diffused region.

* * * * *